(12) United States Patent
Cole et al.

(10) Patent No.: US 7,015,457 B2
(45) Date of Patent: Mar. 21, 2006

(54) SPECTRALLY TUNABLE DETECTOR

(75) Inventors: Barrett E. Cole, Bloomington, MN (US); Robert E. Higashi, Shorewood, MN (US); Arunkumar Subramanian, Plymouth, MN (US); Subash Krishnankutty, North Haven, CT (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/100,298

(22) Filed: Mar. 18, 2002

(65) Prior Publication Data

US 2003/0173504 A1   Sep. 18, 2003

(51) Int. Cl.
*H01J 40/14* (2006.01)

(52) U.S. Cl. ..................... 250/226; 356/519; 359/578; 359/589

(58) Field of Classification Search ............... 250/226, 250/227.23; 356/519, 505–507, 480, 451–454; 359/578, 579, 584, 589, 847, 872, 857; 257/432, 257/433, 436
See application file for complete search history.

(56) References Cited

U.S. PATENT DOCUMENTS

| | | | |
|---|---|---|---|
| 4,614,961 A | 9/1986 | Khan et al. | 357/30 |
| 5,022,745 A * | 6/1991 | Zayhowski et al. | 359/847 |
| 5,040,895 A * | 8/1991 | Laurent et al. | 356/454 |
| 5,146,465 A | 9/1992 | Khan et al. | 372/45 |
| 5,278,435 A | 1/1994 | Van Hove | 257/184 |
| 5,550,373 A * | 8/1996 | Cole et al. | 250/338.1 |
| 5,677,538 A | 10/1997 | Moustakas et al. | 250/370.12 |
| 5,679,965 A | 10/1997 | Schetzina | 257/103 |
| 5,739,554 A | 4/1998 | Edmond et al. | 257/103 |
| 5,834,331 A | 11/1998 | Razeghi | 438/40 |
| 5,847,397 A | 12/1998 | Moustakas | 250/370.06 |
| 5,900,650 A | 5/1999 | Nitta | 257/94 |
| 5,909,280 A * | 6/1999 | Zavracky | 356/454 |
| 6,080,988 A | 6/2000 | Ishizuya et al. | 250/338.1 |
| 6,147,756 A * | 11/2000 | Zavracky et al. | 356/519 |
| 6,287,940 B1 | 9/2001 | Cole et al. | 438/455 |
| 6,295,130 B1 * | 9/2001 | Sun et al. | 356/454 |
| 6,296,779 B1 | 10/2001 | Clark et al. | 216/66 |
| 6,324,192 B1 | 11/2001 | Tayebati | 372/20 |
| 6,380,531 B1 * | 4/2002 | Sugihwo et al. | 250/214.1 |
| 6,590,710 B1 * | 7/2003 | Hara et al. | 359/579 |
| 2002/0018385 A1 * | 2/2002 | Flanders et al. | 365/215 |
| 2002/0031155 A1 | 3/2002 | Tayebati et al. | 372/50 |

FOREIGN PATENT DOCUMENTS

| | | |
|---|---|---|
| EP | 0177918 A | 4/1986 |
| EP | 0667548 A1 | 8/1995 |
| JP | 03-252172 | 11/1991 |
| JP | 05-095130 | 4/1993 |

(Continued)

OTHER PUBLICATIONS

Yang W. et al., "Black-Illuminated GAN/AlGAN Heterojunction Photodiodes With High Quantum Efficiency and Low Noise," Applied Physics Letters, vol. 73, No. 8, Aug. 24, 1998, pp. 1086-1088, XP000777678.

(Continued)

*Primary Examiner*—David Porta
*Assistant Examiner*—Stephen Yam
(74) *Attorney, Agent, or Firm*—Kris T. Fredrick

(57) ABSTRACT

A spectrally tunable optical detector and methods of manufacture therefore are provided. In one illustrative embodiment, the tunable optical detector includes a tunable bandpass filter, a detector and readout electronics, each supported by a different substrate. The substrates are secured relative to one another to form the spectrally tunable optical detector.

25 Claims, 27 Drawing Sheets

FOREIGN PATENT DOCUMENTS

| | | |
|---|---|---|
| JP | 07-288334 | 10/1995 |
| WO | 9326049 A | 12/1993 |

OTHER PUBLICATIONS

Brown, J. et al., "Visible-Blind UV Digital Camera Based on a 32*32 Array of GAN/AIGAN P-I-N Photodiodes", MRS Internet Journal of Nitride Semiconductor Research, vol. 4S1, Sep. 1999, XP000949328 ISSN: 1092-5783.

Sze. "Physics of Semiconductor Devices." pp. 763-765, John Wiley & Sons, N.Y., 1982.

Cole, et al., "Microscopic Spectroscopy of Optical MEMS Devices," Topic 2 (Materials and Technology), Honeywell Laboratories, 2 page abstract, submitted on or around Dec. 11, 2000.

U.S. Appl. No. 09/275,632, filed Mar. 24, 1999, entitled "Back Illuminated Heterojunction Photodiode."

Chung, S. W. et al., "Design and fabrication of 10×10 micro-spatial light modulator array for phase and amplitude modulation," Sensors and Actuators, vol. 78 No. 1, pp. 63-70, Jan. 1999.

Chitica, J., et al., "Monolithic InP-Based Tunable Filter with 10-nm Bandwidth for Optical Data Interconnects in the 1550-nm Band," IEEE Photonics Technology Letters, vol. 11, No. 5, pp. 584-586, May 1999.

Jerman, J.H., et al., "A miniature Fabry-Perot interferometer with a corrugated silicon diaphragm support," Sensors and Actuators, vol. 129, No. 2, pp. 151-158, Nov. 1991.

Tayebati, P., et al., "Microelectromechanical tunable filter with stable half symmetric cavity," Electronics Letters, IEE Stevenage, GB, vol., 34, No. 20, pp. 1967-1968, Oct. 1998.

Tayebati, P., et al., "Widely Tunable Fabry-Perot Filters using High Index-contrast DBRs," Design and Manufacturing of WDM Devices, Dallas, Texas, Nov. 4-5, 1997, SPIE vol., 3234, pp. 206-218, 1998.

* cited by examiner

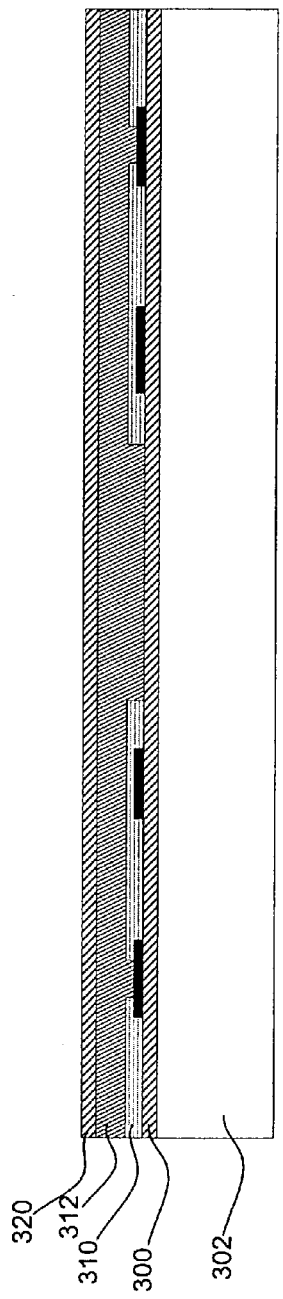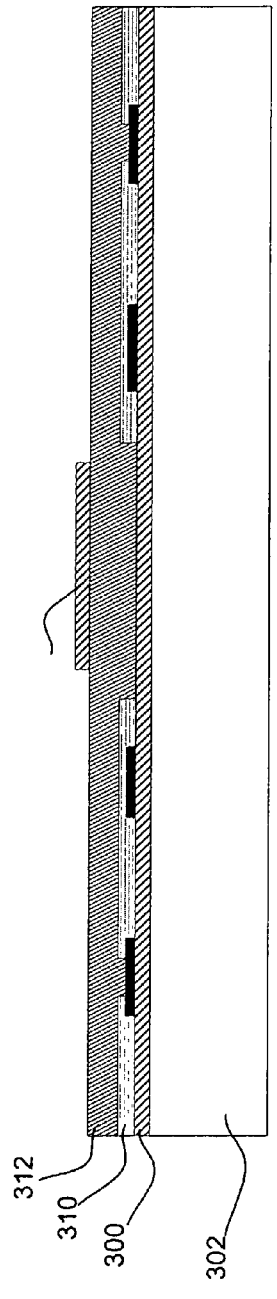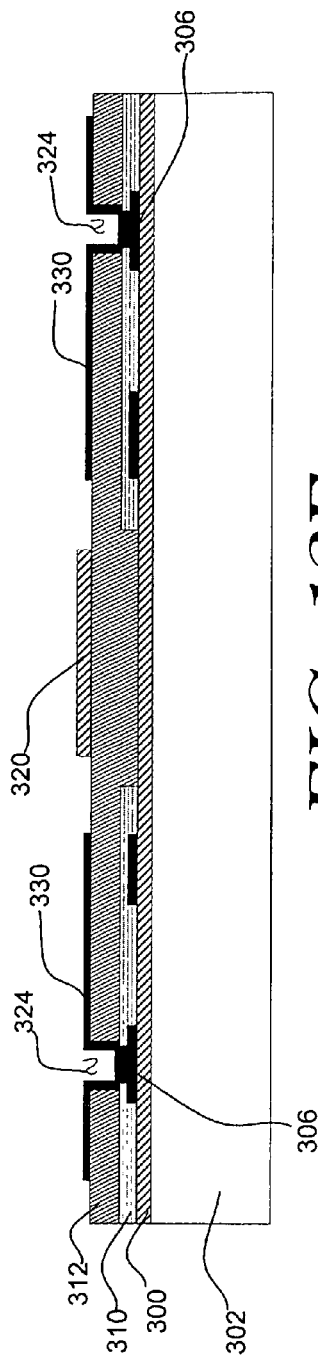

SPECTRALLY TUNABLE DETECTOR

FIELD OF THE INVENTION

The present invention relates to tunable detectors, and more specifically, to spectrally tunable detectors and methods of manufacture therefore.

BACKGROUND OF THE INVENTION

Optical filters are commonly used in a wide variety of applications. For example, optical filters are used to provide separate optical "channels" in optical fiber networks. Optical filters are also used to monitor the spectral emission from the power plants and engines to provide a level of combustion monitoring and control. Optical filters can also be used in biological particle identification systems to provide spectral resolution of the fluorescence needed for high levels of discrimination of biological materials. These are just a few of the many applications for optical filters.

Many optical filters are formed from thin films that reflect or transmit a narrow band of wavelengths. In many cases, such filters are constructed from several hundred layers of stacked narrow band filters, which collectively reflect or transmit a narrow band of wavelengths. Arrayed waveguide gratings are also commonly used. A limitation of many of these filters is that they are not wavelength tunable. That is, the operative wavelength cannot be dynamically changed during operation to select a different optical wavelength.

SUMMARY OF THE INVENTION

The present invention relates to spectrally tunable optical detectors and methods of manufacture therefore. In one illustrative embodiment, the tunable optical detector includes a tunable bandpass filter, a detector, and readout electronics, each supported by a different substrate. The substrates are secured relative to one another to form the spectrally tunable optical detector.

The tunable bandpass filter may include a top plate and a bottom plate. Both the top plate and the bottom plate may be adapted to include a reflective region, and may be separated by a separation gap to form a Fabry-Perot cavity. When so provided, the tunable bandpass filter may be selectively tuned to a desired bandpass wavelength by moving the top plate and/or bottom plate relative to one another to change the separation gap. This movement can be driven by an electrostatic force. The range of movement of the top and/or bottom plate can determine the spectral range of the selected wavelengths. In some embodiments, a lens is positioned adjacent the tunable bandpass filter to help direct and/or shape the incoming light beam.

In one illustrative embodiment, the top plate is suspended above the bottom plate by one or more supporting legs and/or posts. One or more top electrodes are mechanically coupled to the top plate, and one or more bottom electrodes are mechanically coupled to the bottom plate. The one or more bottom electrodes are preferably in registration with the one or more top electrodes. When an electric potential is applied between corresponding top and bottom electrodes, an electrostatic force is generated to pull the top plate toward the bottom plate, which changes the separation gap of the Fabry-Perot cavity. In some embodiments, the movement to the top plate is provided by the temporary deformation of one or more of the supporting legs that suspend the top plate above the bottom plate.

A detector is preferably disposed adjacent the tunable bandpass filter. The detector receives the one or more wavelengths that are passed through the tunable bandpass filter. Preferably, the detector is sensitive to the entire spectral range of wavelengths that can be selected by the tunable bandpass filter, but this is not required.

In one embodiment, the tunable bandpass filter is supported by a first substrate, and the detector is supported by a second substrate. The first and second substrates are preferably substantially transparent to the expected spectral range of wavelengths. On some embodiments, the first and second substrates are secured together in a back-to-back fashion. When arranged in this manner, the wavelengths of interest pass, in sequence, through the tunable bandpass filter, the first substrate, and the second substrate, before reaching the detector. Alternatively, and in other embodiments, the first and second substrates are secured together in a front-to-back fashion. When arranged in this manner, the wavelengths of interest pass, in sequence, through the first substrate, the bandpass filter, and the second substrate, before reaching the detector. Other arrangements of the first and second substrates are also contemplated, including a back-to-front arrangement and a front-to-front arrangement, as desired.

In some embodiments, readout electronics are provided on a third substrate. The readout electronics may be electrically connected to one or more electrodes of the detector through, for example, one or more bump bonds, one or more wire bonds, a common carrier or package, etc. Alternatively, the readout electronics may be provided on the first and/or second substrates, if desired.

BRIEF DESCRIPTION OF THE DRAWINGS

FIGS. 12A–12I are schematic cross-sectional side views showing another illustrative method for making a tunable bandpass filter in accordance with the present invention;

DETAILED DESCRIPTION OF THE PREFERRED EMBODIMENTS

Figure 1:
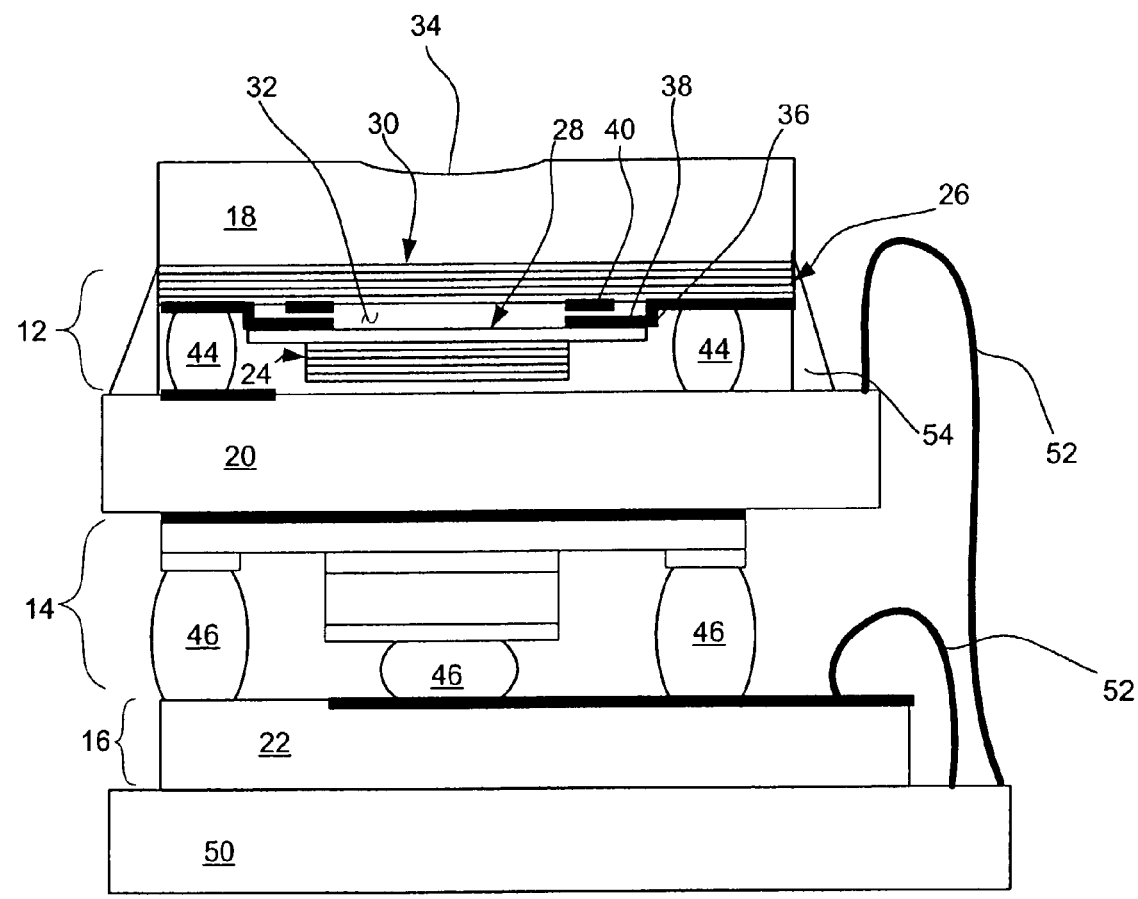
FIG. 1 is a schematic cross-sectional side view of an illustrative tunable bandpass detector in accordance with the present invention.

The following description should be read with reference to the drawings wherein like reference numerals indicate like elements throughout the several views. The detailed description and drawings are presented to show embodiments that are illustrative of the claimed invention.

FIG. 1 is a schematic cross-sectional side view of an illustrative tunable bandpass detector 10 in accordance with the present invention. The illustrative tunable bandpass detector 10 includes a tunable bandpass filter 12, a detector 14 and readout electronics 16, each supported by a different substrate. For example, the tunable bandpass filter 12 is supported by a first substrate 18, the detector 14 is supported by a second substrate 20, and the readout electronics 16 are supported by a third substrate 22.

In the illustrative embodiment, the tunable bandpass filter 12 includes a Micro Electro Optical Mechanical System (MEOMS) etalon. The MEOMS includes a top plate 24 and a bottom plate 26. The bottom plate 26 may correspond to the first substrate 18, or other layers provided on the first substrate 18, as desired. Both the top plate 24 and the bottom plate 26 may be adapted to include a reflective region. In FIG. 1, the top plate includes a reflective region 28, which may include for example a Distributed Bragg reflector that includes a semiconductor and/or dielectric mirror stack. Alternatively, the reflective region 28 may simply include one or more metal layers, such as an Aluminum layer. It should be recognized that these are only illustrative, and that the reflective region 28 may be made from any suitable material or material system that provides the desired reflectivity. Like the top plate, the bottom plate 26 may include a reflective region 30, which like above, may be made from any suitable material or material system that provides the desired reflectivity.

The top plate 24 and the bottom plate 26 are preferably separated by a separation gap 32 to form a Fabry-Perot cavity. To selectively tune the tunable bandpass filter 12 to a desired bandpass wavelength, the top plate is preferably pulled toward the bottom plate 26, which changes the separation gap 32. The range of movement of the top plate 24 relative to the bottom plate 26 determines the spectral range of the wavelengths that can be selected. In some embodiments, a lens 34 is positioned adjacent the tunable bandpass filter 12 to help direct and/or shape the incoming light beam.

In a preferred embodiment, the top plate 24 is suspended above the bottom plate 26 by one or more supporting legs and/or posts 36. In addition, one or more top electrodes 38 may be mechanically coupled to the top plate 24, and one or more bottom electrodes 40 may be mechanically coupled to the bottom plate 26. When an electric potential is applied between corresponding top electrodes 38 and bottom electrodes 40, an electrostatic force is generated to pull the top plate 24 toward the bottom plate 26. This changes the separation gap 32 of the Fabry-Perot cavity. In some embodiments, the electrostatic force causes one or more supporting legs 36 to deform, which provides the movement of the reflective region 28 of the top plate 24 relative to the bottom plate 26. In a preferred embodiment, the reflective region 28 is relatively rigid to help prevent curvature across the reflective region 28 when actuated.

The detector 14 is preferably disposed adjacent the tunable bandpass filter 12, and receives the one or more wavelengths that are passed through the tunable bandpass filter 12. Preferably, the detector 14 is sensitive to the entire spectral range of wavelengths that can be passed through the tunable bandpass filter 12. In an illustrative embodiment, the detector 14 is an AlGaN PIN photodiode, such as described in co-pending commonly assigned U.S. patent application Ser. No. 09/275,632, to Wei Yang et al., filed Mar. 24, 1999, and entitled "BACK-ILLUMINATED HETEROJUNCTION PHOTODIODE".

In the illustrative embodiment shown in FIG. 1, the tunable bandpass filter 12 is supported by the first substrate 18, and the detector 14 is supported by a second substrate 20. The first and second substrates are preferably substantially transparent to the expected spectral range of wavelengths. The first substrate can be selected for its transmission properties allowing only the proper range of wavelengths to be transmitted. In one illustrative embodiment, the first substrate is Pyrex and the second substrate is sapphire. The first and second substrates may be secured together in a front-to-back fashion, as shown in FIG. 1. That is, the front side of the first substrate 18 is provided adjacent to the back side of the second substrate 20. Bump bonds 44 or the like may be used to secure the first substrate 18 to the second substrate 20, and to make any electrical connection therebetween, as desired. A dielectric seal 54 may be provided as shown to protect the tunable bandpass filter 12. In some embodiments, the dielectric seal 54 provides a vacuum seal. Arranged in this manner, the wavelengths of interest pass, in sequence, through the first substrate 18, the bandpass filter 12, and the second substrate 20, before reaching the detector 14.

Figure 2:
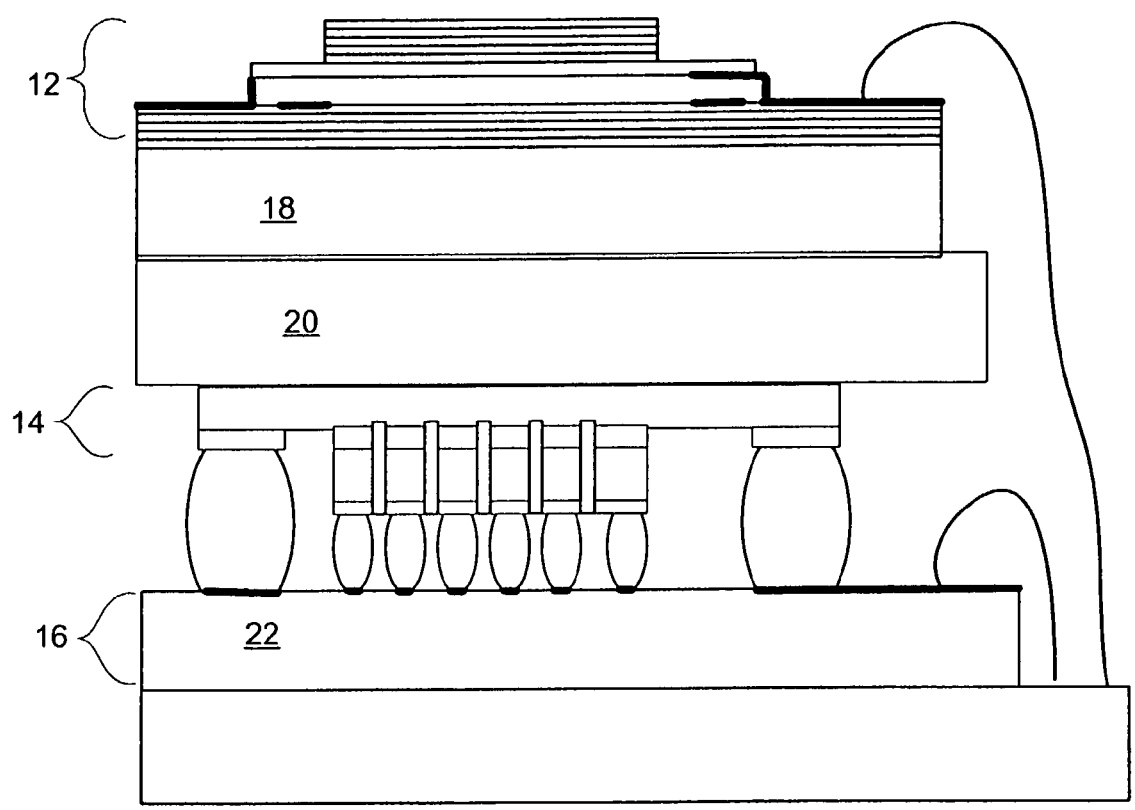
FIG. 2 is a schematic cross-sectional side view of another illustrative tunable bandpass detector in accordance with the present invention.

Alternatively, and as shown in FIG. 2, the first and second substrates may be secured together in a back-to-back fashion. That is, the back side of the first substrate 18 may be secured to the back side of the second substrate 20. Arranged in this manner, the wavelengths of interest may pass, in sequence, through the tunable bandpass filter 12, the first substrate 18, and the second substrate 20, before reaching the detector or detectors 14. Other arrangements of the first and second substrates are also contemplated, including a back-to-front arrangement and a front-to-front arrangement, as desired.

In some embodiments, readout electronics are provided on a third substrate 22. The readout electronics are preferably fabricated using conventional integrated circuit processing techniques. For example, the readout electronics may be fabricated using a CMOS process on a silicon substrate 22. Metal pads may be provided to provide electrical connections to the detector 14. In the embodiment shown in FIG. 1, bump bonds 46 are used to electrically connect one or more electrodes (usually combinations of each pixel and a common ground terminal) of the detector 14 to corresponding metal pads of the readout electronics. The bump bonds may also be used to secure the third substrate 22 relative to the second substrate 20, as shown. The third substrate may be mounted to a package 50, if desired. In the illustrative embodiment, bond wires 52 are used to connect selected package pins to the readout electronics and the electrodes of the tunable bandpass filter 12, as shown.

FIG. 2 is a schematic cross-sectional side view of another illustrative tunable bandpass detector in accordance with the present invention. The embodiment shown in FIG. 2 is similar to the embodiment shown in FIG. 1. However, unlike the embodiment of FIG. 1, the first and second substrates are secured together in a back-to-back fashion. That is, the back side of the first substrate 18 is secured to the back side of the second substrate 20. Arranged in this manner, the wavelengths of interest pass, in sequence, through the tunable bandpass filter 12, the first substrate 18, and the second substrate 20, before reaching the detector(s) 14. Another difference is that the detector 14 includes an array of detectors. Such an array of detectors 14 may be used to capture an array of pixels to form an image, rather than a single pixel as shown in FIG. 1. While FIGS. 1 and 2 show some illustrative methods to assemble various components to form a tunable bandpass filter, it should be recognized that any suitable method may be used, including those further described below.

Figure 3:
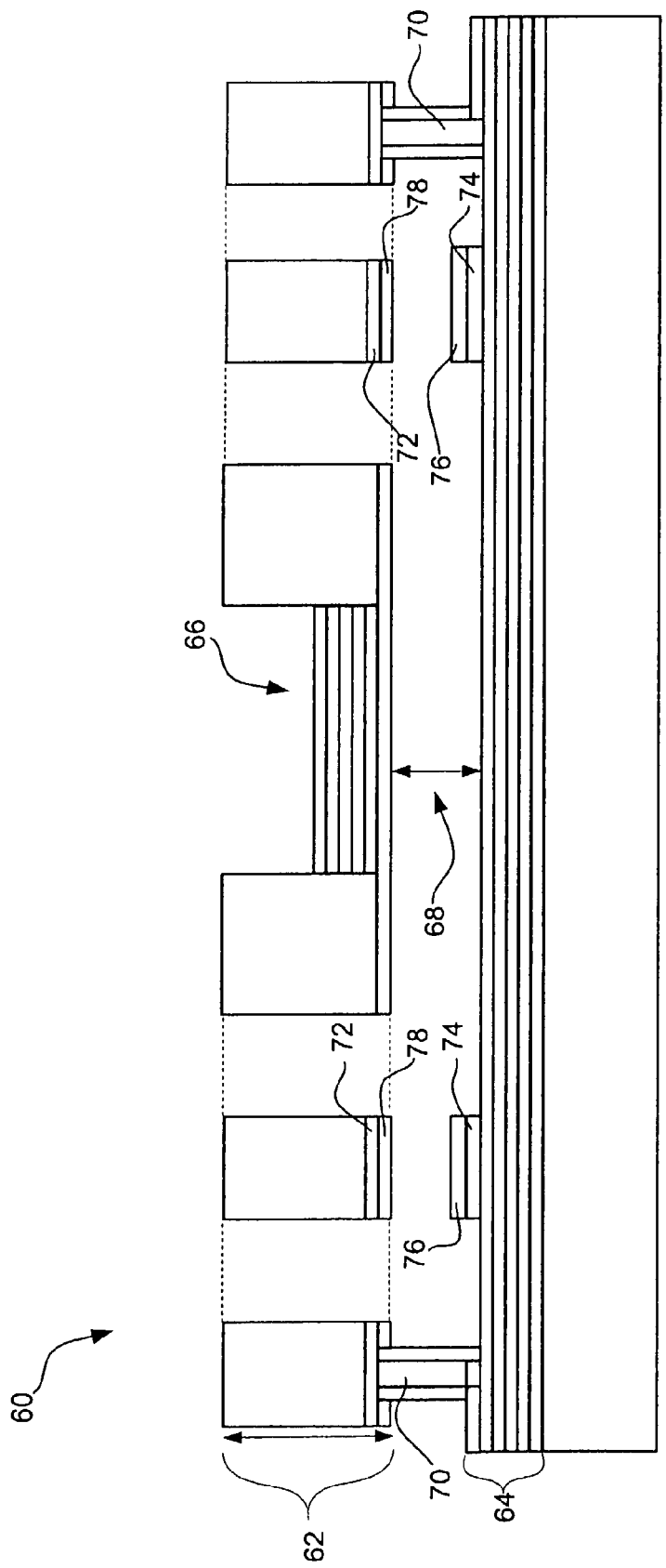
FIG. 3 is a schematic cross-sectional side view of another illustrative tunable bandpass filter in accordance with the present invention.

FIG. 3 is a schematic cross-sectional side view of an illustrative tunable bandpass filter in accordance with the present invention. The illustrative tunable bandpass filter 60 includes a top plate 62 and a bottom plate 64. Both the top plate 62 and the bottom plate 64 may be adapted to include a reflective region. In the illustrative embodiment, the top plate 62 includes a reflective region 66, which in the embodiment shown, includes a Distributed Bragg reflector that has a semiconductor and/or dielectric mirror stack. Likewise, the bottom plate 64 may include a reflective region 30, which in the embodiment shown, extends across the entire surface of the bottom plate 64 and may include a Distributed Bragg reflector that has a semiconductor and/or dielectric mirror stack. Alternatively, the reflective regions 66 and 64 may simply include one or more metal layers, such as an Aluminum layer. It should be recognized that these are only illustrative, and that the reflective regions 66 and 64 may be made from any suitable material or material system that provides the desired reflectivity.

As discussed above, the top plate 62 and the bottom plate 64 are preferably separated by a separation gap 68 to form a Fabry-Perot cavity. To selectively tune the tunable bandpass filter 60 to a desired bandpass wavelength, the top plate 62 is preferably pulled toward the bottom plate 64, which changes the separation gap 68. The range of movement of the top plate 62 relative to the bottom plate 64 determines the spectral range of the wavelengths of interest.

As shown in FIG. 3, the top plate 62 is suspended above the bottom plate 64 by one or more supporting legs and/or posts 70. In addition, one or more top electrodes 72 may be mechanically coupled to the top plate 62, and one or more bottom electrodes 74 may be mechanically coupled to the bottom plate 64. The one or more top electrodes 72 are preferably in registration with the one or more bottom electrodes 74. A dielectric layer 76 may be provided over the one or more bottom electrodes 74, and/or a dielectric layer 78 may be provided over the one or more top electrodes 72. These dielectric layers may help protect the top and bottom electrodes from environmental conditions, and may help prevent a short when the top plate is fully actuated toward the bottom plate.

When an electric potential is applied between top electrodes 72 and bottom electrodes 74, an electrostatic force is generated that pulls the reflective region 66 of the top plate 62 toward the bottom plate 64 to change the separation gap 68 of the Fabry-Perot cavity. In some embodiments, the electrostatic force causes at least part of the supporting legs to at least temporarily deform to provide the necessary movement of the reflective region 66.

Figure 4:
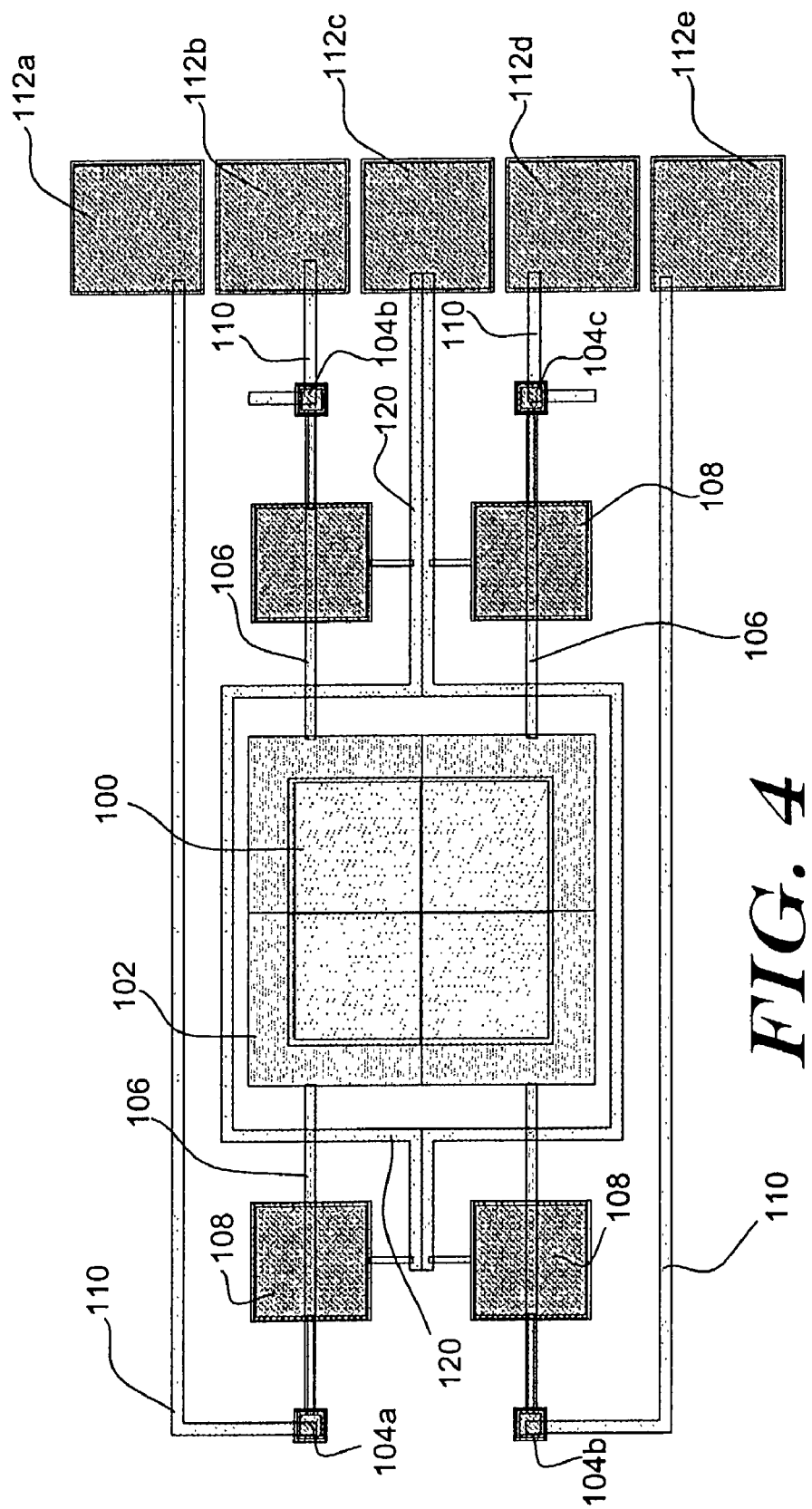
FIG. 4 is a layout of an illustrative bandpass filter in accordance with the present invention.

FIG. 4 is a layout of an illustrative bandpass filter in accordance with the present invention. The bottom substrate is not shown. The top plate includes a reflective region 100, which may include for example a Distributed Bragg reflector with a semiconductor and/or dielectric mirror stack, one or more metal layers, or any other material or material system that provides the desired reflectivity. In one illustrative embodiment, the reflective region 100 includes a Distributed Bragg reflector that has a number of alternating layers of $ZrO_2/SiO_2$, $HfO_2/SiO_2$, or any other suitable material system. The bottom plate (not shown) also preferably has a reflective region that is positioned below the reflective region 100 of the top plate to form a Fabry-Perot cavity therebetween.

In the illustrative embodiment, the reflective region 100 of the top plate is secured to a top support member 102. The illustrative top support member 102 has a ring that extends around and is secured to the reflective region 100. In the illustrative embodiment, the top support member 102 also includes four thin supporting legs 106. The thin supporting legs 106 are used to suspend the ring and reflective region 100 above the bottom plate. In the illustrative embodiment, the thin supporting legs are mechanically secured to posts 104a–104d. Posts 104a–104d preferably extend upward from the bottom plate and support the top support member 102. The top support member may be, for example, $SiO_2$ or any other suitable material or material system.

Each thin supporting leg 106 has an electrode region 108 that supports a top electrode, as shown. Each top electrode region 108 preferably has an interconnect line that extends along the corresponding supporting leg to a corresponding anchor or post 104. Each post 104a–104d preferably provides a conductive path that electrical connects the interconnect lines of the top electrodes to corresponding interconnect lines 110 on the bottom plate.

In the illustrative embodiment, the interconnect lines 110 on the bottom plate electrically connect each of the posts 104a–104d to a corresponding pad 112a–112d, respectively. Rather than connecting the posts to corresponding pads, it is recognized that the interconnect lines 110 may electrically connect the posts 104a–104d to one or more driving circuits, if desired. In addition, it is contemplated that the interconnect lines may be electrically tied together so that all of the top electrodes are commonly driven.

Bottom electrodes are preferably positioned below each of the top electrodes. In the example shown, interconnect lines 120 electrically connect each of the bottom electrodes to a single pad 114. Thus, in the illustrative embodiment, all of the bottom electrodes are commonly driven. However, this is not required.

To tune the illustrative bandpass filter to a desired band of wavelengths, an electrical potential is provided between the bottom electrodes and the top electrodes. When an electric potential is applied in such a manner, an electrostatic force is generated that pulls the electrode region 108 of the top plate toward the bottom plate to change the separation gap of the Fabry-Perot cavity. In some embodiments, the electrostatic force causes the supporting legs 106 of the top support plate 102 to deform to provide the necessary movement of the reflective region 100. Preferably, the top support member 102 is relatively rigid to help prevent curvature across the reflective region 100 when actuated.

Figure 5:
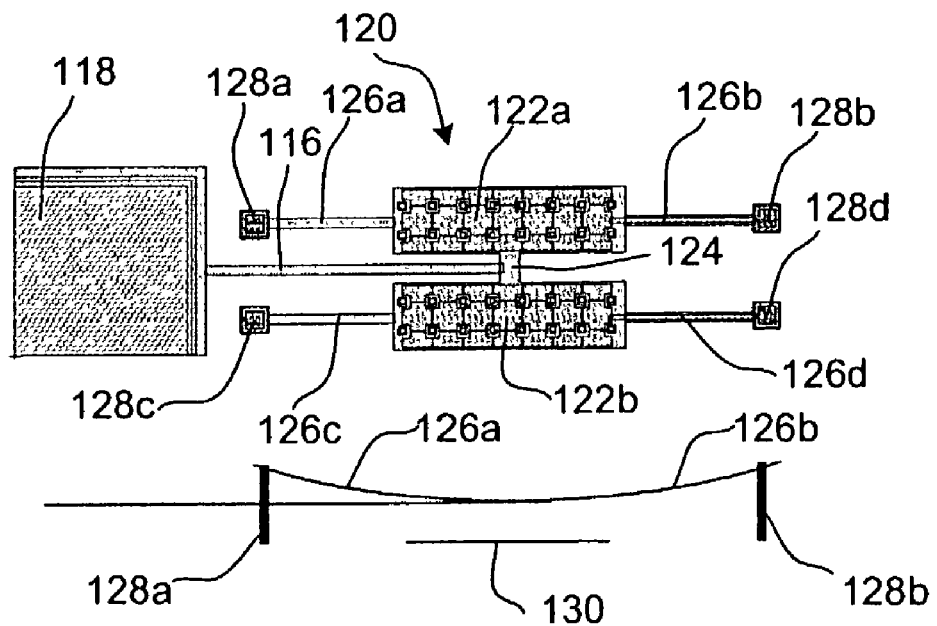
FIG. 5 is a layout showing a support leg, posts and top and bottom electrodes of another illustrative bandpass filter in accordance with the present invention.

FIG. 5 is a layout showing a support leg 116, posts 128a–128d and top and bottom electrodes of another illustrative bandpass filter in accordance with the present invention. In this illustrative embodiment, support leg 116 is shown with one end attached to the top support member 118 of a top reflective region, and the other end attached to a bridge portion 124 of a top electrode 120. The illustrative top electrode 120 is "H" shaped with a first electrode leg portion 122a and a second electrode leg portion 122b connected by a bridge portion 124. The first electrode leg portion 122a is suspended above a bottom plate by elongated supporting legs 126a and 126b, which are connected to posts 128a and 128b, respectively. The second electrode leg portion 122b is suspended in a similar manner.

When a potential is applied between the first and second electrode leg portions 122a and 122b and a corresponding bottom electrode 130, the elongated supporting legs 126a–126d deform at least temporarily down toward the bottom plate 130. Because the supporting leg 116 is connected to the bridge portion 124, which is situated at a central location with respect to the first and second electrode leg portions 122a and 122b, the supporting leg 116 may not substantially deform when providing movement to the top support member 118. This may help reduce any deformation of the top support member 118 when the top support member 118 is moving from an upward position toward the bottom plate.

Figure 6:
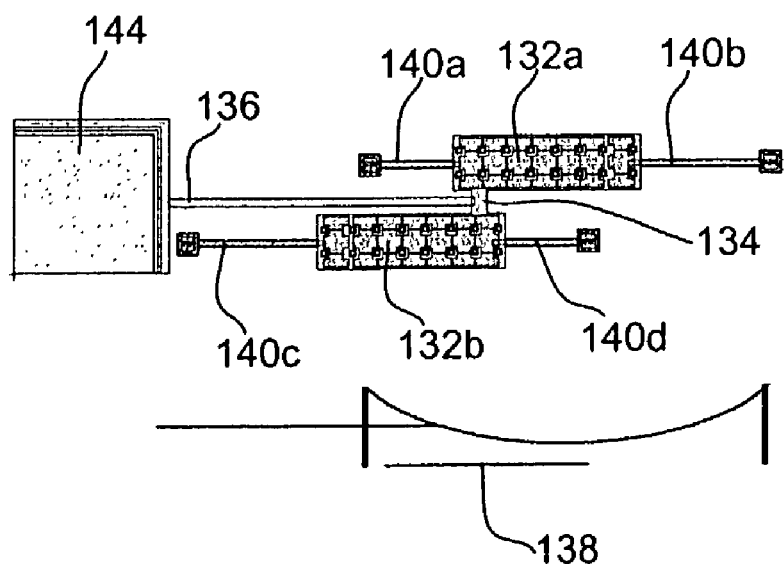
FIG. 6 is a layout showing a support leg, posts and top and bottom electrodes of yet another illustrative bandpass filter in accordance with the present invention.

FIG. 6 is a layout showing a support leg 136, posts and top and bottom electrodes of yet another illustrative bandpass filter in accordance with the present invention. In this illustrative embodiment, the top electrode includes a first electrode portion 132a and a second electrode portion 132b, which are offset relative to one another as shown. Support leg 136 is shown with one end attached to the top support member 144 of a top reflective region, and the other end attached to a bridge portion 134 of a top electrode 132. The bridge portion 134 connects two adjacent ends of the first electrode portion 132a and the second electrode portion 132b, as shown.

When a potential is applied between the first and second electrode portions 132a and 132b and a corresponding bottom electrode 138, the elongated supporting legs 140a–140d deform at least temporarily down toward the bottom plate. In this embodiment, an intermediate part of the first and second electrode portions 132a and 132b preferably snap down, and in some embodiments, actually engage the bottom electrode 138. As more potential is then applied, the first and second electrode portions 132a and 132b may begin to roll down toward the bottom electrode 138, which lowers the position of the supporting leg 136 and the support member 144. This rolling action may provide greater control over the movement of the top support member 144 relative to the bottom plate.

Figure 7:
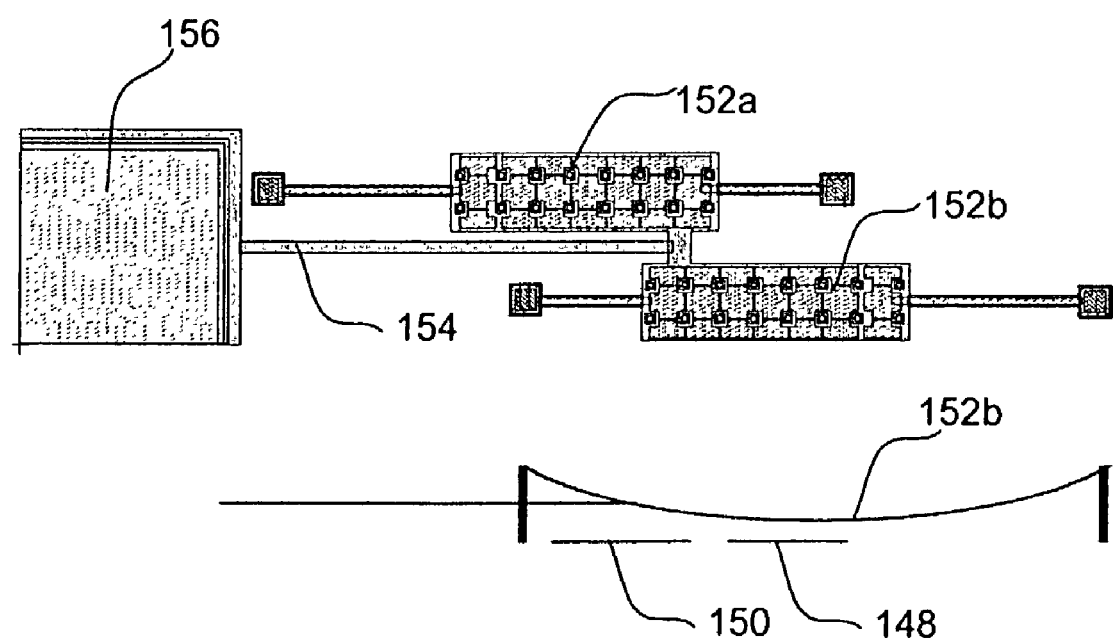
FIG. 7 is a layout showing a support leg, posts and top and bottom electrodes of another illustrative bandpass filter in accordance with the present invention.

FIG. 7 is a layout showing a support leg, posts and top and bottom electrodes of another illustrative bandpass filter in accordance with the present invention. FIG. 7 is similar to the embodiment shown in FIG. 6, but has two separate bottom electrodes 148 and 150. During operation, a relatively high potential is applied between one of the bottom electrodes, such as electrode 148, to cause an intermediate portion of the first and second electrode portions 152a and 152b to snap down, and in some embodiments, to actually engage the bottom electrode 148. With the first and second electrode portions 152a and 152b in the snapped down position, the support member 154 is preferably in an upper most position.

Then, smaller potential may be applied between the first and second electrode portions 152a and 152b and the other bottom electrode 150. This potential may cause the first and second electrode portions 152a and 152b to begin to roll down toward the bottom electrode 150, which like above, may cause the supporting leg 154 and support member 156 to move to a lower position. As noted above, this rolling action may provide greater control over the movement of the top support member 156 relative to the bottom plate.

Figure 8:
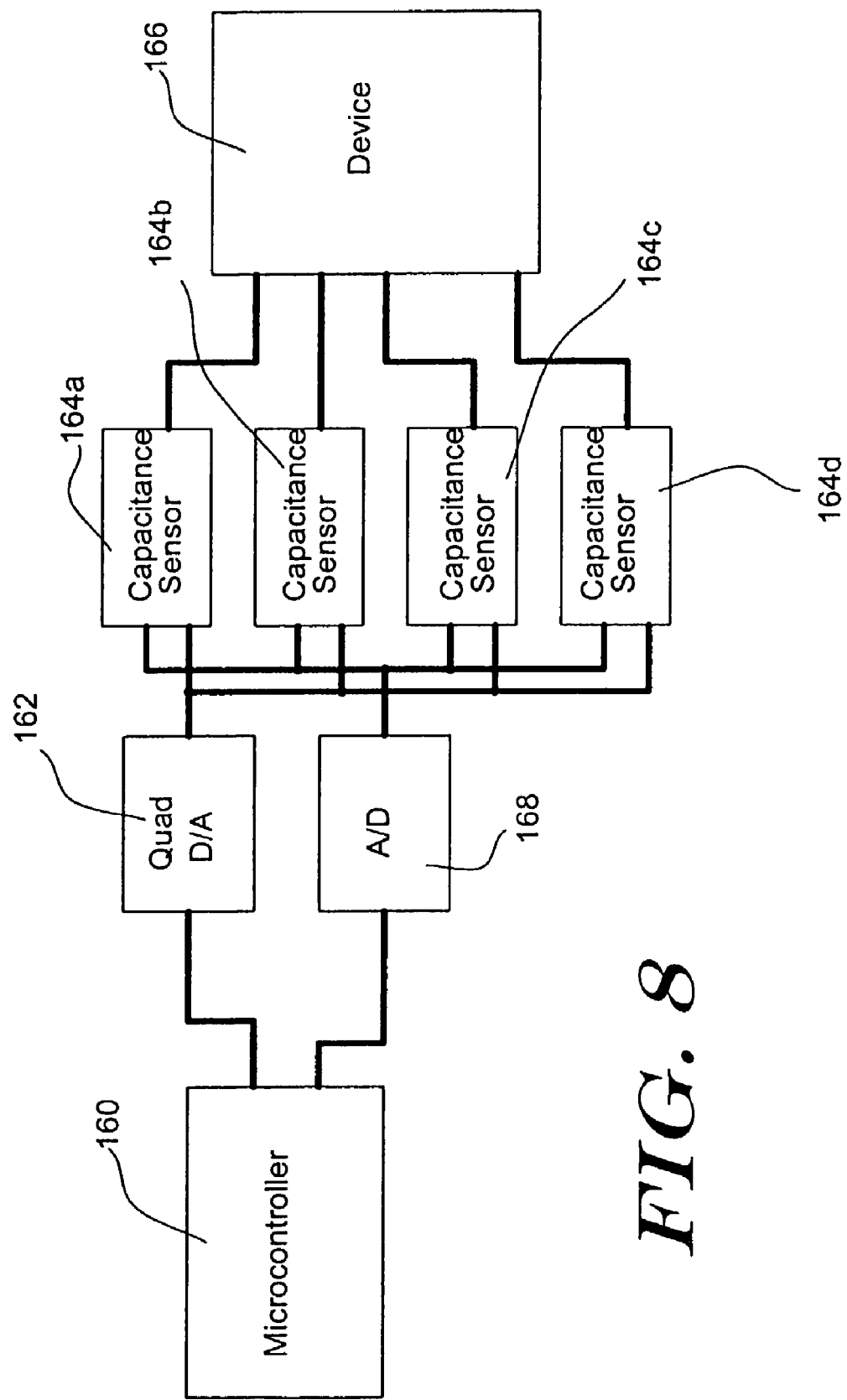
FIG. 8 is a schematic diagraph showing an illustrative control circuit for controlling a bandpass filter in accordance with the present invention.

FIG. 8 is a schematic diagraph showing an illustrative control circuit for controlling the bandpass filter of FIG. 4. A microcontroller 160 provides four control words to a Quad Digital-to-Analog (D/A) converter 162. The Quad D/A converter 162 provides individual analog signals to each of the capacitance sensors 164a–164d. In one embodiment, the four capacitance sensors 164a–164b correspond to the four pairs of top and bottom electrodes of FIG. 4. Alternatively, separate capacitance sensors may be provided. The individual analog signals provide the necessary electric potential to pull the top plate toward the bottom plate by a desired amount to change the separation gap of the Fabry-Perot cavity. One advantage of providing individual signals to each of the electrode pairs is to help control the tilt of the top plate. If tilt is not a concern, a single analog signal may be used to commonly drive all four electrode pairs of FIG. 4.

Feedback signals may be provided from each of the capacitance sensors 164a–164b back to the microcontroller 160 through an Analog-to-Digital (A/D) converter 168. The feedback signals may be used to provide a measure of the capacitance between each electrode pair of FIG. 4. The measure of capacitance is proportional to the separation gap between each electrode pair. When so provided, the microcontroller 160 may adjust each of the four control words provided to the Quad D/A converter 162 so that the capacitance between each electrode pair is substantially equal. This may help reduce and/or control the tilt in the top plate relative to the bottom plate.

Figure 9:
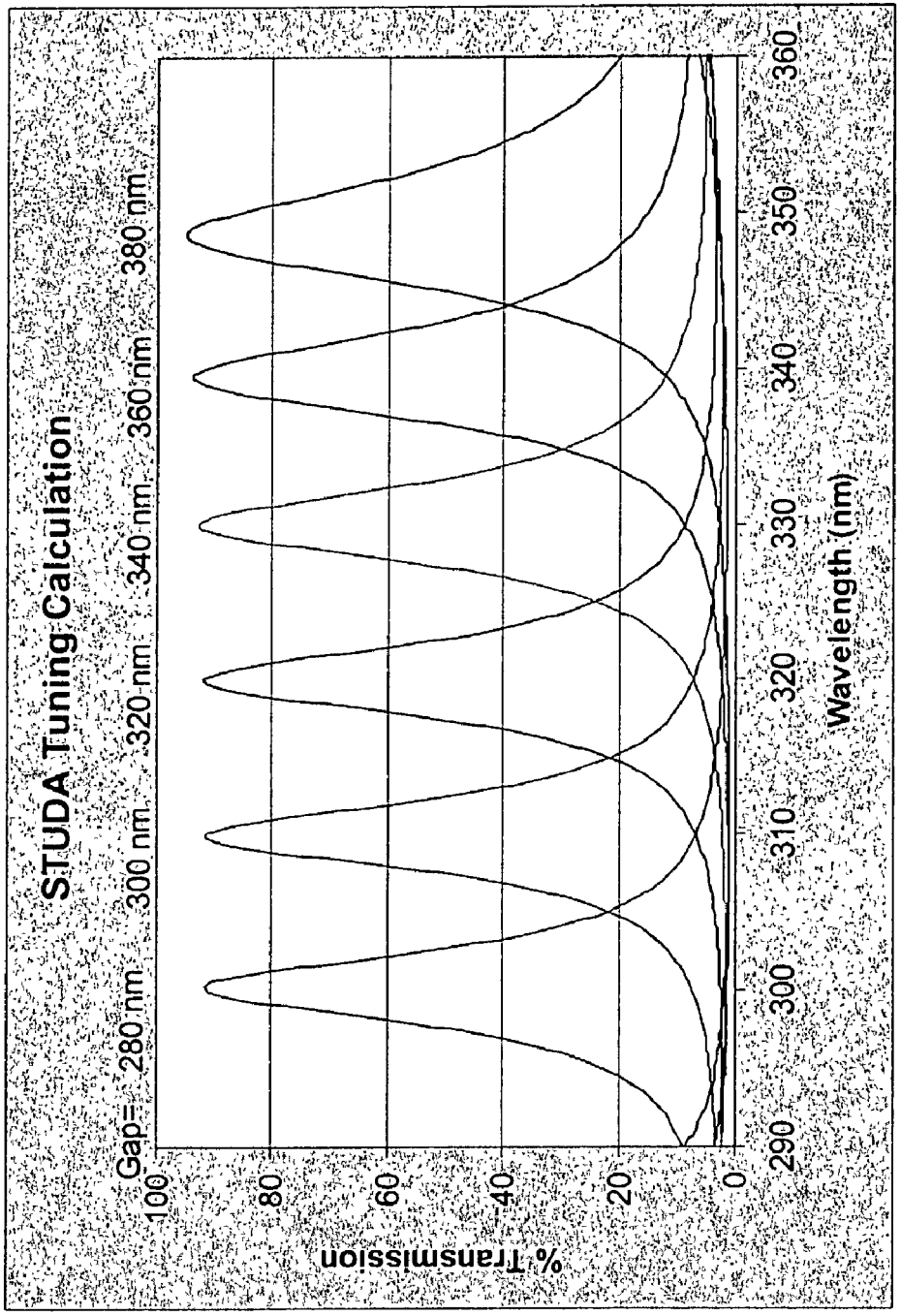
FIG. 9 is a graph showing the calculated percent transmission of the tunable filter of FIG. 3 versus wavelength and gap.

FIG. 9 is a graph showing the calculated percent transmission of the tunable filter of FIG. 3 alone versus incoming wavelength and separation gap. The separation gap between the top plate and the bottom plate is shown across the top of the graph. The wavelength of the incoming light beam is shown across the bottom of the graph. The percentage of the incoming light that is transmitted through the bandpass filter is shown along the "y" axis. As can be seen, as the separation gap increases, the peak wavelength that is transmitted through the bandpass filter also increases. Thus, the bandpass frequency of the filter can be controlled by simply changing the separation gap between the top and bottom plates. It is recognized that other separations of a similar fractional wavelength can produce similar effects.

Figure 10:
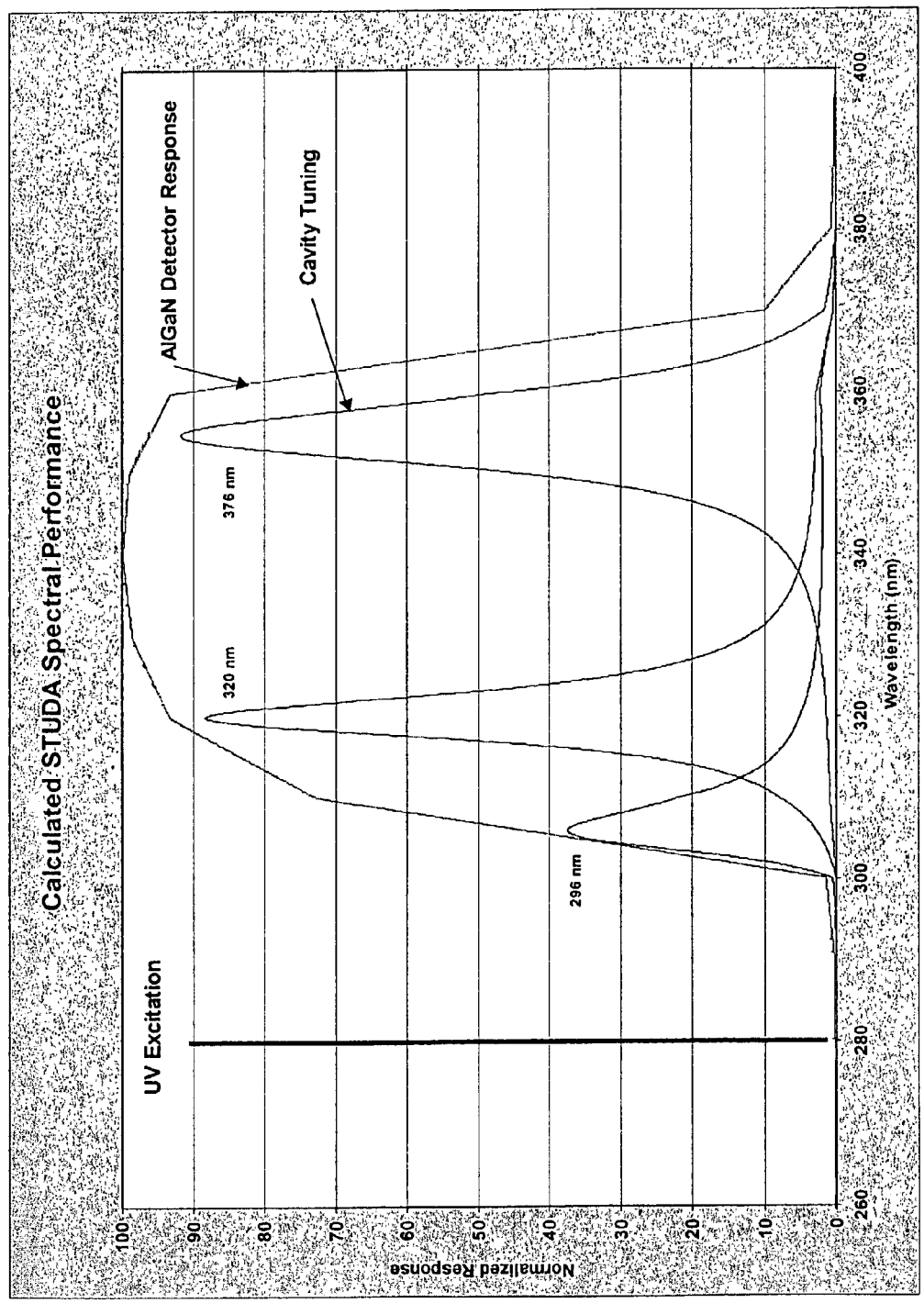
FIG. 10 is a graph showing the calculated normalized response of the tunable bandpass detector of FIG. 3 versus wavelength.

FIG. 10 is a graph showing the calculated normalized response of the tunable bandpass detector of FIG. 3 versus wavelength. The wavelength of the incoming light is shown along the "X" axis, and the normalized response is along the "Y" axis. A first curve 200 shows the normalized response versus wavelength for a separation gap of 320 nm. Likewise, a second curve 202 shows the normalized response versus wavelength for a separation gap of 376 nm. The range of movement of the top and/or bottom plate determines the spectral range of the wavelengths of interest. In the example shown, the top and/or bottom plate can be moved between a separation gap of 320 nm to 376 nm. This produces a spectral range of the bandpass filter from about 320 nm to about 355 nm.

Preferably, the response of the detector and transmission of the substrate is set to encompass the entire expected spectral range of bandpass filter. Curve 204 shows such a spectral range. Curve 204 encompasses the entire spectral range from about 320 nm to about 355 nm of the bandpass filter.

Figure 11A:
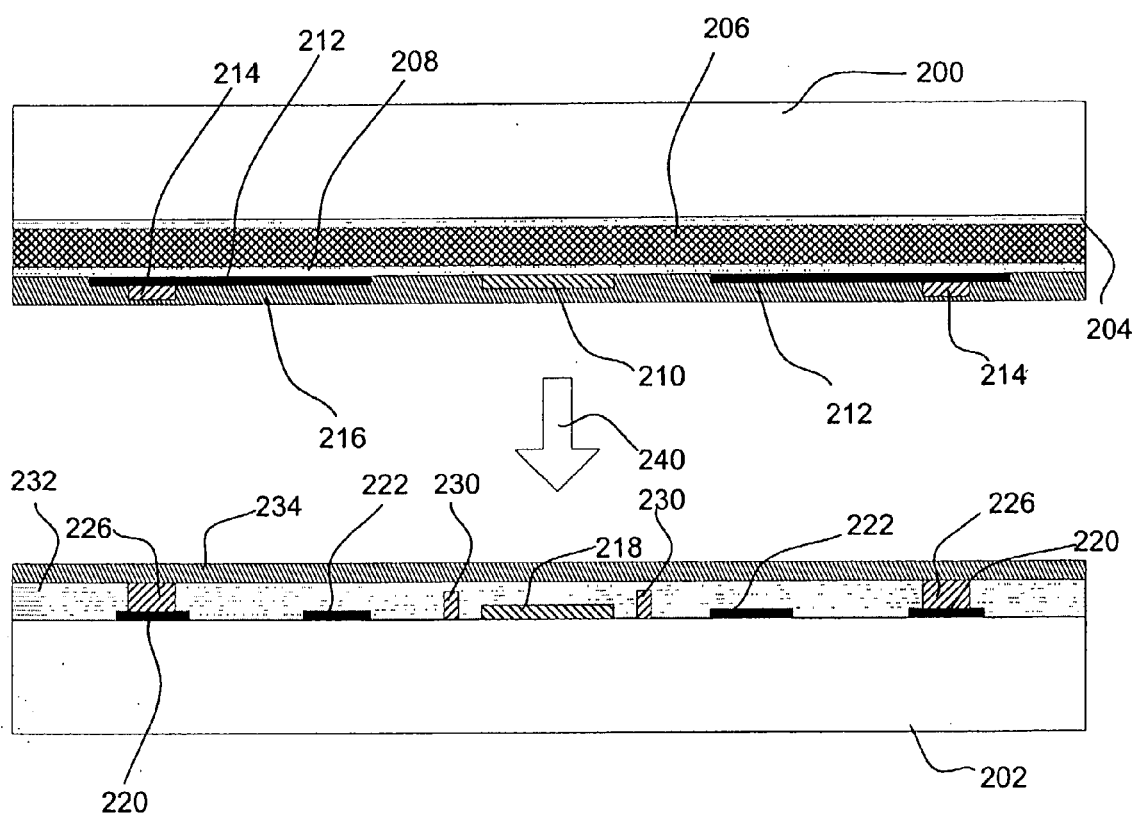
FIGS. 11A–11F are schematic cross-sectional side views showing an illustrative method for making a tunable bandpass filter in accordance with the present invention.

A number of illustrative methods are contemplated for forming a tunable bandpass filter in accordance with the present invention. FIGS. 11A–11F are schematic cross-sectional side views showing one such illustrative method. Turning to FIG. 11A, a first substrate 200 and a second substrate 202 are provided. The first substrate 200 is preferably a silicon wafer or some other suitable material. The second substrate 202 is preferably a silica substrate, glass, Pyrex, sapphire or some other suitable material. The second substrate 202 is preferably relatively optically transparent to the desired wavelength of interest (such as UV).

Turning again to FIG. 11A, an etch stop layer 204 is provided on the first substrate 200. The etch stop layer may be any type of etch stop layer, but in the illustrative embodiment, is preferably molybdenum. Molybdenum is preferred because it can be easily removed, such as with hydrogen peroxide, to separate the first substrate from the remaining structure, as further described below. Next a support layer 206 is provided. The support layer is preferably polysilicon, but any suitable material will do. A buffer layer 208 may be provided if desire to help bond the mirror region to the polysilicon support layer 206, as further discussed below.

Next, a top mirror 210 is provided and patterned. The top mirror is preferably a Distributed Bragg reflector that includes a semiconductor and/or dielectric mirror stack. The Distributed Bragg reflector may include, for example, a number of alternating layers of $ZrO_2/SiO_2$, $HfO_2/SiO_2$, etc. Alternatively, the top mirror may simply include one or more metal layers, such as an Aluminum layer. It should be recognized that these are only illustrative, and that the top mirror may be made from any suitable material or material system that provides the desired reflectivity.

Once patterned as shown, upper electrodes 212 are provided and patterned. The upper electrodes 212 are preferably metal, such as aluminum, copper or some other suitable conductor. Conductive pads 214 are then provided, as shown. Finally, a layer of polyimide 216 is provided over the top mirror 210, upper electrodes 212 and conductive pads 214, as shown. (OK w/o deletion).

A bottom mirror 218 is provided and patterned on the second substrate 202, as shown. The bottom mirror is preferably a Distributed Bragg reflector that includes a semiconductor and/or dielectric mirror stack. Alternatively the bottom mirror may not be patterned. Like the top mirror 210, the Distributed Bragg reflector may include, for example, a number of alternating layers of $ZrO_2/SiO_2$, $HfO_2/SiO_2$, etc. Alternatively, the top mirror may simply include one or more metal layers, such as one or more Aluminum layers. It should be recognized that these are only illustrative, and that the top mirror may be made from any suitable material or material system that provides the desired reflectivity. In some embodiments, the bottom mirror 218 is not patterned, and is left to cover the entire surface of the second substrate 202.

Bottom electrodes 222 and bottom pads 220 are then provided and patterned. Bottom electrodes 222 are preferably arranged to be in registration with the upper electrodes 212. Likewise, bottom pads 220 are preferably arranged to be in registration with the upper conductive pads 214. Bottom conductive pads 226 are preferably provided on top of bottom pads 220, as shown. Bottom conductive pads 226 and top conductive pads 214 are preferably sized to provide the desired separation between the top mirror 210 and the bottom mirror 218.

The bottom conductive pads 226 and top conductive pads 214 are preferably formed using conventional metal film processing techniques. Since metal film processing techniques are typically accurate to Angstrom like thickness over short distances, the desired separation gap may be achieved across the structure. Standoffs 230 may be provided to help prevent the top mirror 210 from engaging the bottom mirror 218 during actuation of the bandpass filter, as further described below.

A first layer 232 of polyimide is then provided. The first layer 232 of polyimide is heated and hard cured. A second layer of polyimide 234 is also provided. Like the layer of polyimide 216 discussed above, the second layer of polyimide 234 is preferably only soft cured.

Figure 11B:
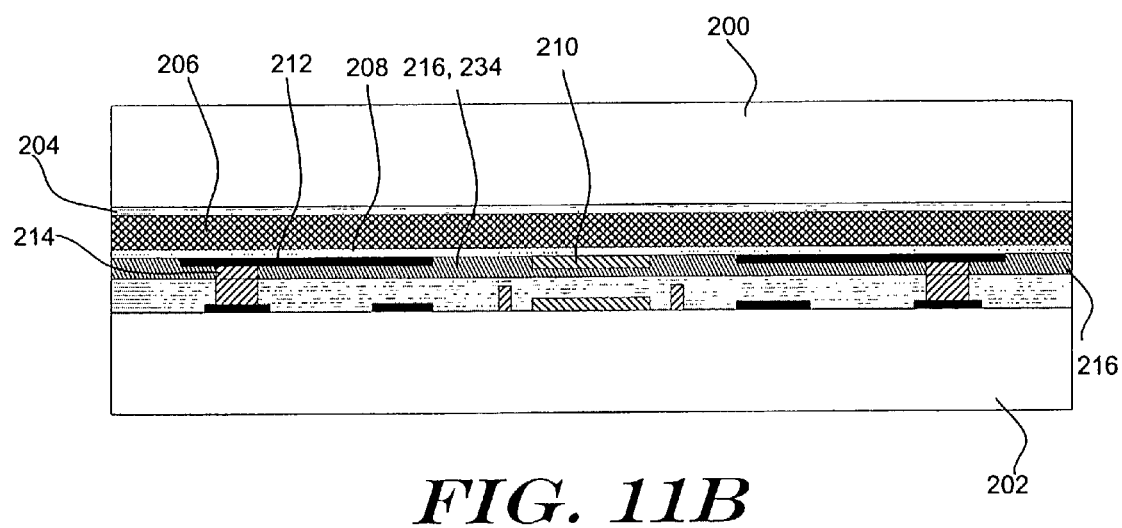

Next, the first substrate 200 is preferably brought into engagement with the second substrate 202, as indicated by arrow 240. The result is shown in FIG. 11B. This step uses polyimide adhesion. Because the polyimide layers 216 and 234 are only soft cured, they remain deformable. Preferably, the two substrates are assembled in a wafer bonding process where heat, pressure and vacuum are applied. The vacuum helps remove trapped constituents. The pressure is used to force the two substrates together. The heat (e.g. to 400 degrees C.) hard cures the polyimide to form a fused substrate sandwich.

Figure 11C:
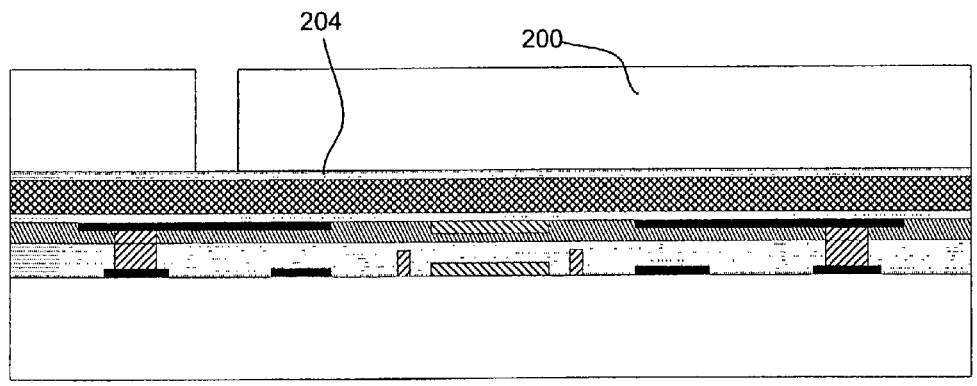

Next, and as shown in FIG. 11C, holes are etched through the first substrate 200, preferably down to the etch stop layer 204. Next, the etch stop layer 204 is removed to release the first substrate 200 from the structure. When the etch stop layer 204 is molybdenum, a hydrogen peroxide solution can be used to remove the etch stop layer and release the first substrate.

Figure 11D:
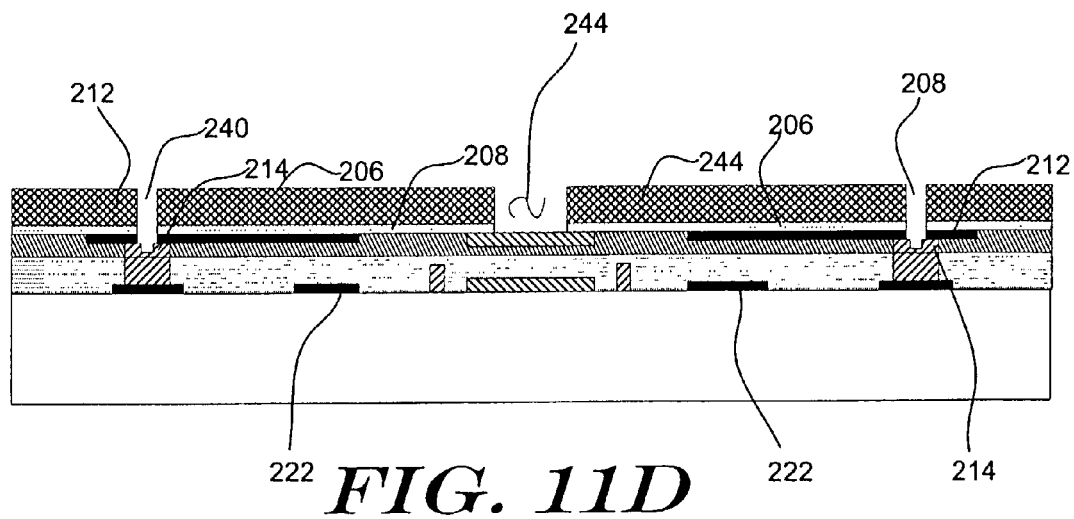

Next, and as shown in FIG. 11D, holes 240 are etched through the polysilicon layer, the buffer layer 208, the upper electrodes 212, and into the upper conductive pads 214. Also, a window 244 is etched through the polysilicon layer and the buffer layer 208 to expose the top mirror 210.

Figure 11E:
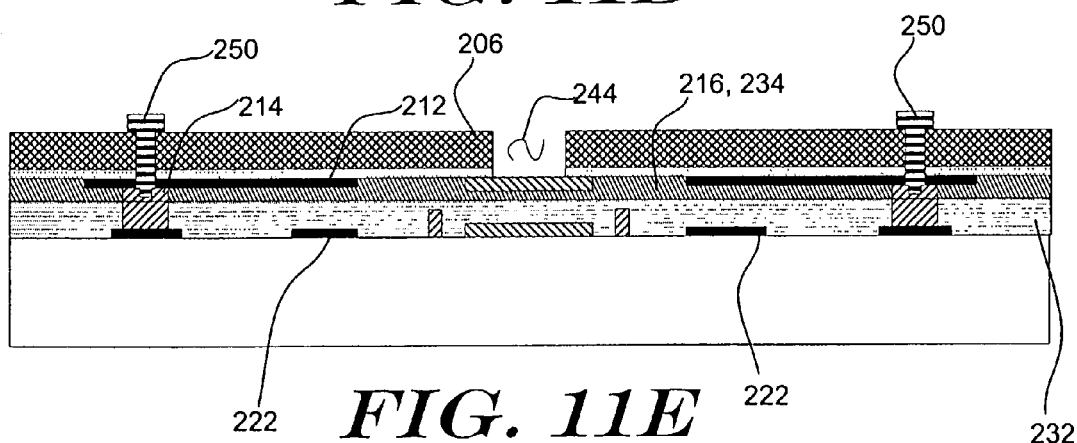
Figure 11F:
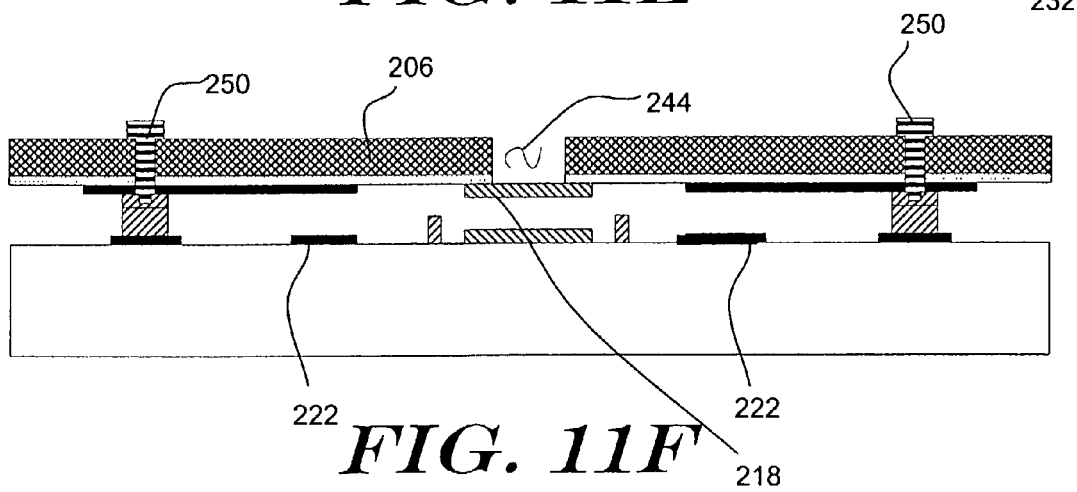

Next, and as shown in FIG. 11E, metal is deposited into the etched holes 240 to provide plugs 250 that make electrical contact to both the upper electrodes 212 and the conductive pads 214. Besides providing an electrical connection, the plugs 250 also help pin the polysilicon support layer 206 to the conductive pads 214. A final dry etch (e.g. an oxygen plasma etch) is used to removes the polyimide sacrificial layers 216, 234 and 232 to release the top structure from the bottom structure, as shown in FIG. 11F.

Figure 12A:
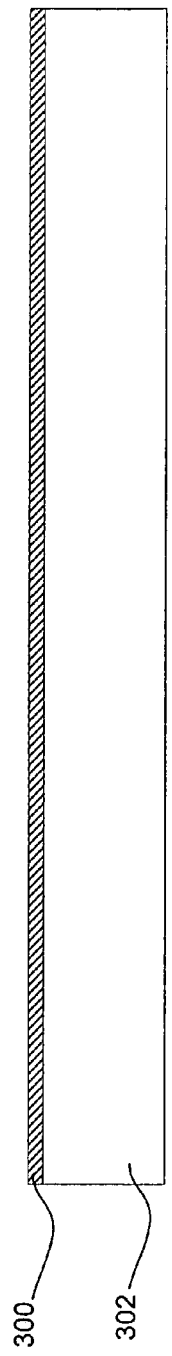

FIGS. 12A–12I are schematic cross-sectional side views showing yet another illustrative method for making a tunable bandpass filter in accordance with the present invention. Turning first to FIG. 12A, a bottom mirror 300 is grown on a substrate 302. The bottom mirror 300 is preferably a Distributed Bragg reflector that includes a semiconductor and/or dielectric mirror stack. The Distributed Bragg reflector may include, for example, a number of alternating layers of $ZrO_2/SiO_2$, $HfO_2/SiO_2$, etc. Alternatively, the bottom mirror may simply include one or more metal layers, such as one or more Aluminum layers. It should be recognized that these are only illustrative, and that the bottom mirror 300 may be made from any suitable material or material system that provides the desired reflectivity.

Figure 12B:
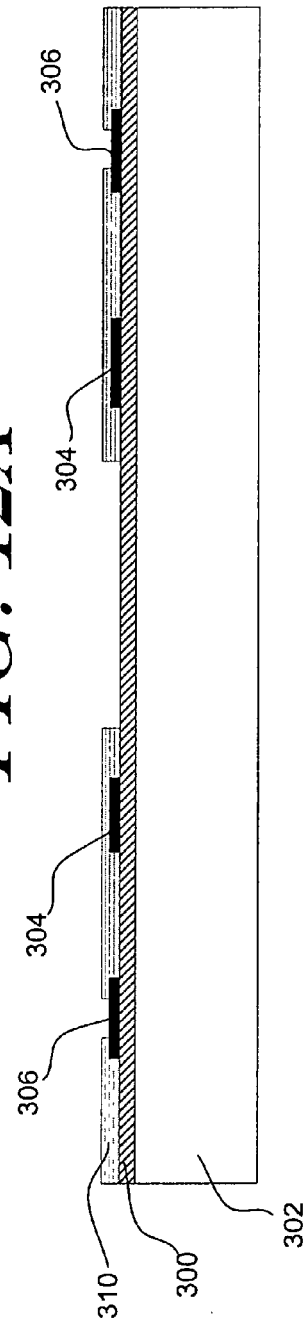

Next, and as shown in FIG. 12B, bottom electrodes 304 and bottom conducting pads 306 are provided. A dielectric or other protecting layer 310 is then provided over the bottom electrodes 304 and bottom conducting pads 306. The dielectric or other protecting layer 310 is then patterned to expose the bottom conducting pads 306, as shown.

Figure 12C:
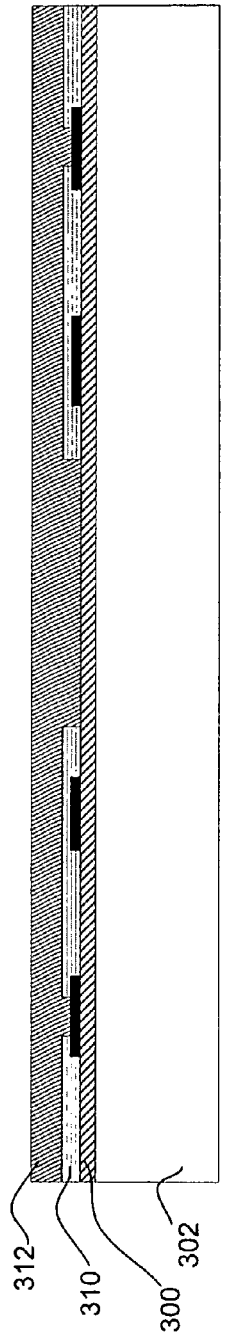

Next, and as shown in FIG. 12C, a sacrificial layer 312 is provided. The sacrificial layer 312 is preferably polyimide, but may be any suitable material. Next, and as shown in FIG. 12D, a top mirror 320 is provided. The top mirror 320 is preferably a Distributed Bragg reflector that includes a semiconductor and/or dielectric mirror stack. Like the bottom mirror 300, the Distributed Bragg reflector may include, for example, a number of alternating layers of $ZrO_2/SiO_2$, $HfO_2/SiO_2$, etc. Alternatively, the top mirror may simply include one or more metal layers, such as one or more Aluminum layers. It should be recognized that these are only illustrative, and that the top mirror may be made from any suitable material or material system that provides the desired reflectivity. The top mirror 320 is then patterned, as shown in FIG. 12E.

Next, and as shown in FIG. 12F, holes 324 are etched through the polyimide layer 312 down to the conductive pads 306. Next, a metal layer is deposited and pattered to form top electrode regions 330. The metal extends into holes 324 to form an electrical connection with bottom conducting pads 306, as shown.

Figure 12G:
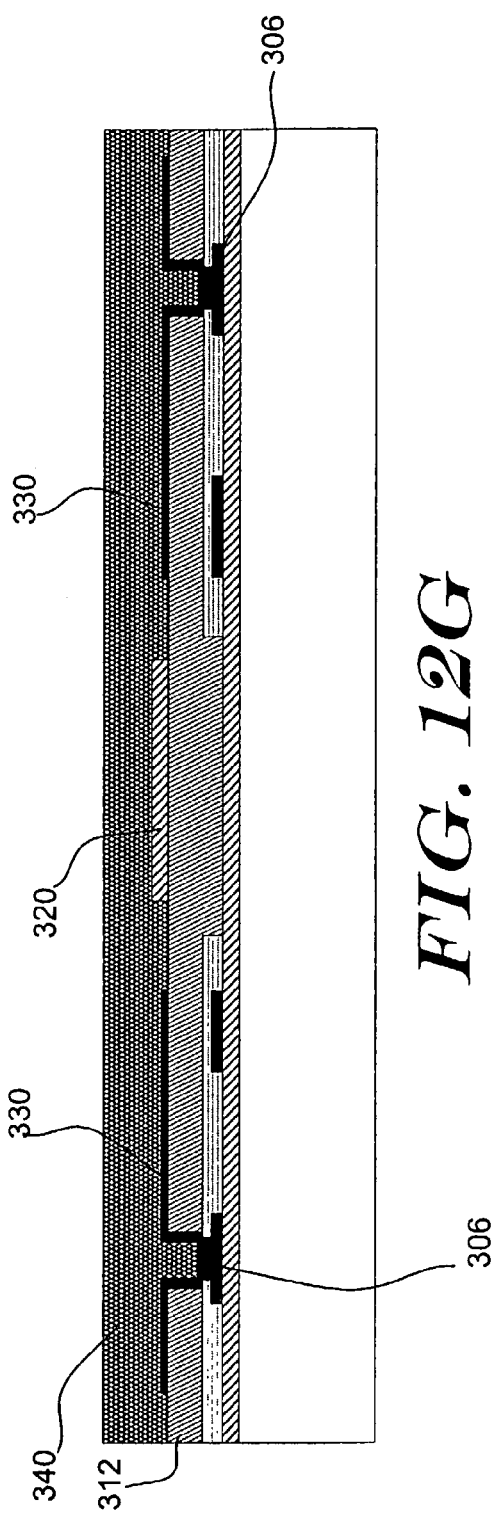
Figure 12H:
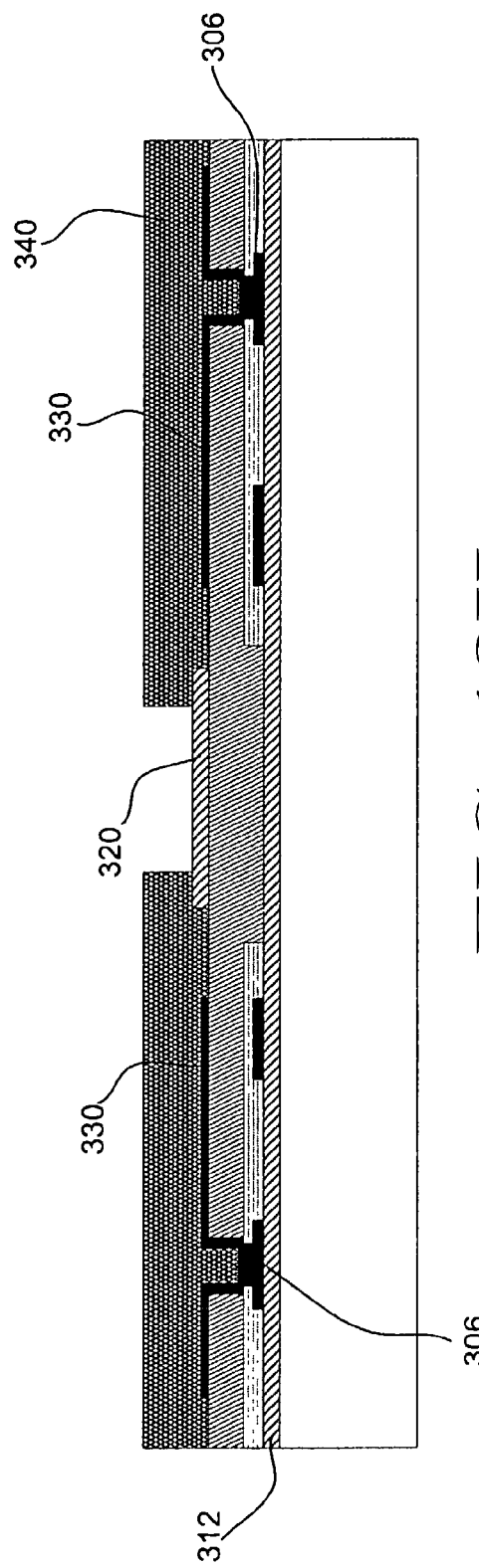

Next, and as shown in FIG. 12G, a support layer 340 is provided over the top surface of the structure. The support layer preferably bonds to the top mirror 320, and fills the holes 324. A buffer layer may be provided first to help bond the layers, if desired. In a preferred embodiment, the support layer 340 is $SiO_2$.

Figure 12I:
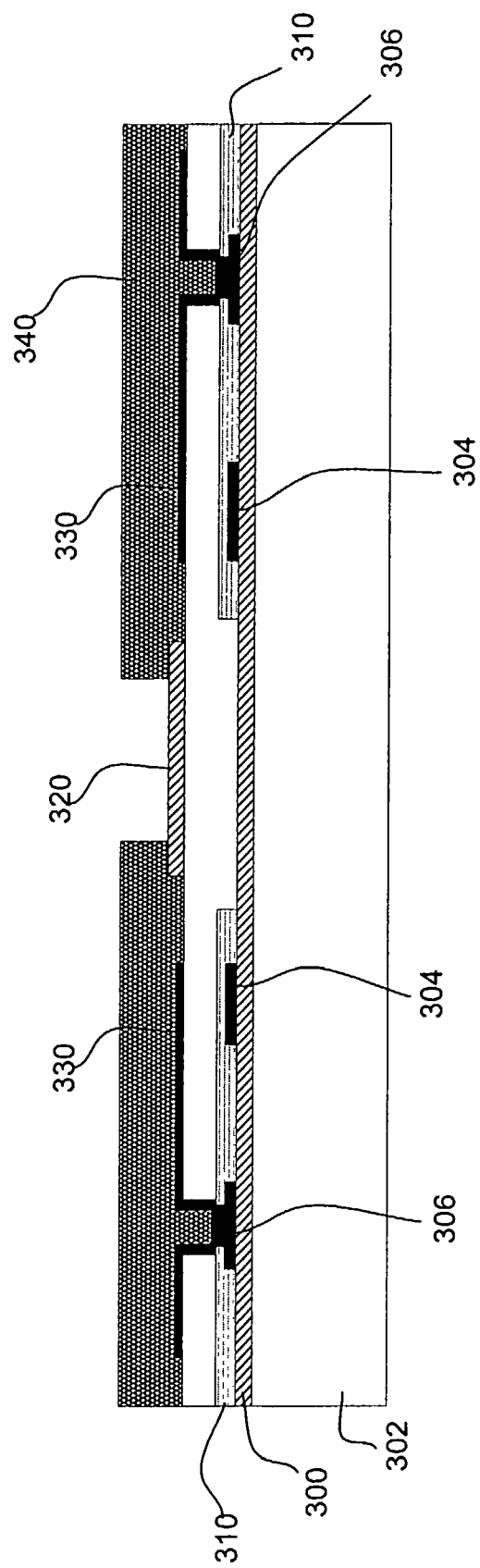

Next, the support layer 340 is patterned to expose the top mirror 320. Preferably the support layer 340 overlaps the outer perimeter of the top mirror 320, as shown. This overlap helps form a bond between the support layer 340 and the top mirror 320. Finally, and as shown in FIG. 12I, a dry etch is used to remove the polyimide sacrificial layer 312 to releases the top structure from the bottom structure, as shown. The dry etch is preferably an oxygen plasma etch. Note, the dielectric or protective layer 310 may help prevent an electrical short between the top electrodes 330 and the bottom electrodes 304 if they are drawn together under electrostatic actuation. An anneal may be performed to help reduce the stress in the structure, including the $SiO_2$ support layer 340. The anneal can be performed before or after the polyimide sacrificial layer 312 is removed, as desired.

Figure 13A:
FIGS. 13A–13H are schematic cross-sectional side views showing another illustrative method for making a tunable bandpass filter in accordance with the present invention.

FIGS. 13A–13H are schematic cross-sectional side views showing another illustrative method for making a tunable bandpass filter in accordance with the present invention. Turning first to FIG. 13A, a bottom mirror 400 is grown on a substrate 402. The bottom mirror 400 is preferably a Distributed Bragg reflector that includes a semiconductor and/or dielectric mirror stack. The Distributed Bragg reflector may include, for example, a number of alternating layers of $ZrO_2/SiO_2$, $HfO_2/SiO_2$, etc. Alternatively, the bottom mirror 400 may simply include one or more metal layers, such as an Aluminum layer. It should be recognized that these are only illustrative, and that the bottom mirror 400 may be made from any suitable material or material system that provides the desired reflectivity.

Figure 13B:
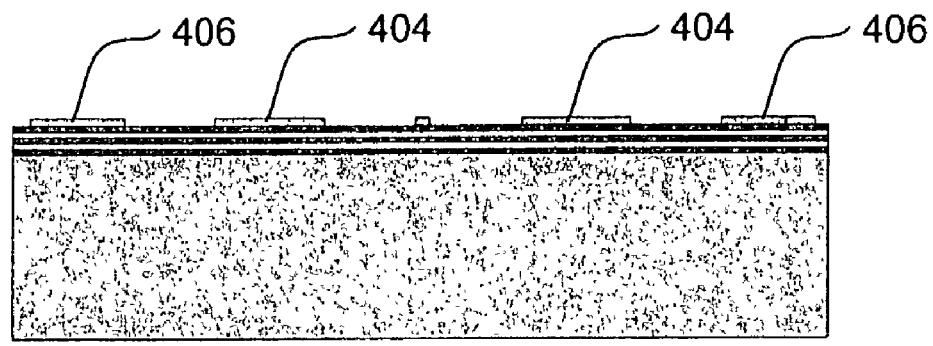

Next, and as shown in FIG. 13B, bottom electrodes 404 and bottom conducting pads 406 are provided. A dielectric or other protecting layer 410 may be provided over the bottom electrodes 404 and bottom conducting pads 406 (see FIG. 13C). The dielectric or other protecting layer 410 may then be patterned to expose the bottom conducting pads 406, as shown in FIG. 13C.

Figure 13C:
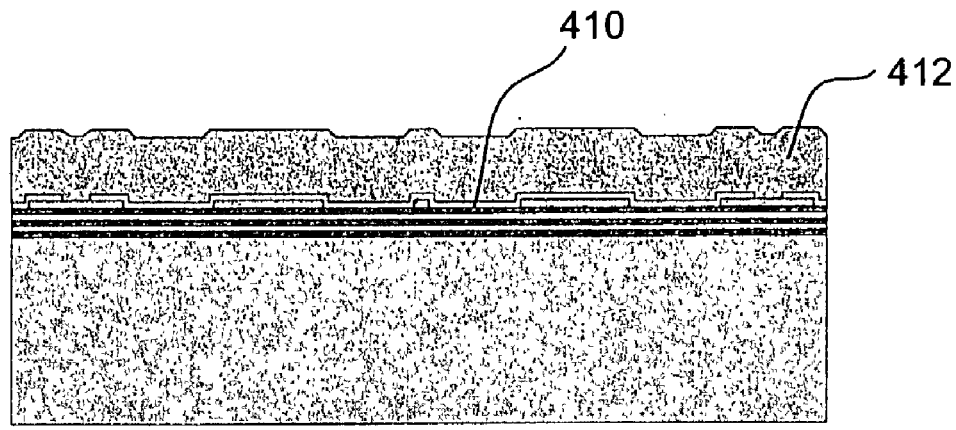
Figure 13D:
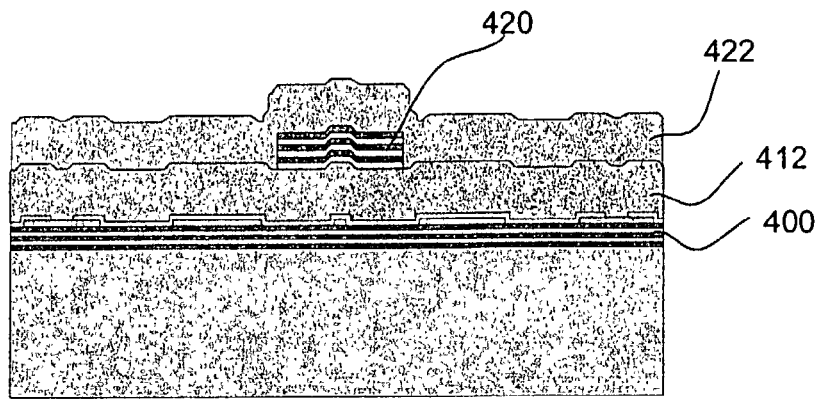

Next, and as shown in FIG. 13C, a first sacrificial layer 412 is provided. The first sacrificial layer 412 is preferably polyimide, but may be any suitable material. Next, and as shown in FIG. 13D, a top mirror 420 is provided. The top mirror 420 is preferably a Distributed Bragg reflector that includes a semiconductor and/or dielectric mirror stack. Like the bottom mirror 400, the Distributed Bragg reflector may include, for example, a number of alternating layers of $ZrO_2/SiO_2$, $HfO_2/SiO_2$, etc. Alternatively, the top mirror 420 may simply include one or more metal layers, such as one or more Aluminum layers. It should be recognized that these are only illustrative, and that the top mirror may be made from any suitable material or material system that provides the desired reflectivity. The top mirror 420 is then patterned, as shown in FIG. 13D. Then, a second sacrificial layer 422 is provided over the first sacrificial layer 412 and the patterned top mirror 420.

Figure 13E:
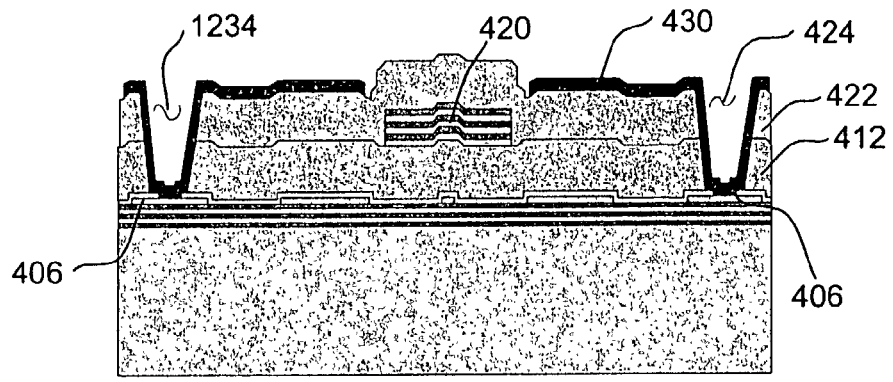

Next, and as shown in FIG. 13E, holes 424 are etched through the first sacrificial layer 412 and the second sacrificial layer 422 down to the conductive pads 406. Next, a metal layer is deposited and patterned to form top electrode regions 430. The metal layer preferably extends into holes 424 to form an electrical connection with bottom conducting pads 406, as shown.

Figure 13F:
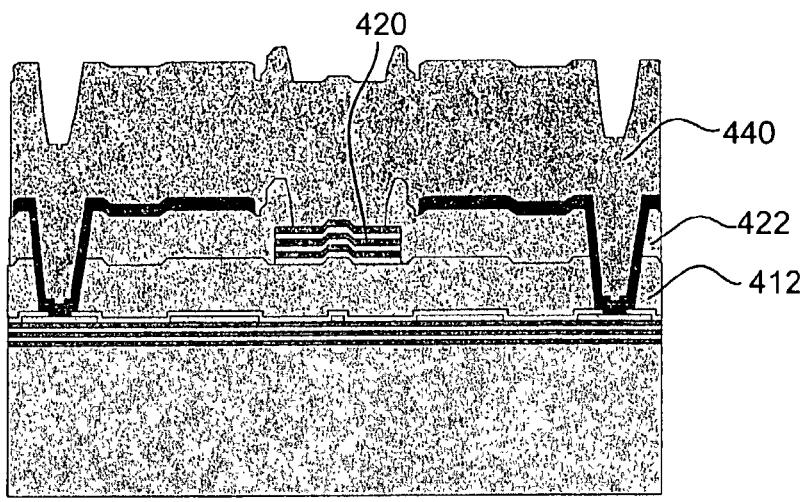

Next, and as shown in FIG. 13F, the portion of the second sacrificial layer 422 above the top mirror 420 is removed. A support layer 440 is then provided over the top surface of the resulting structure. The support layer 440 preferably bonds to the top mirror 420, and fills the holes 424. A buffer layer may be provided first to help bond the layers, if desired. In a preferred embodiment, the support layer 440 is $SiO_2$, but this is not required.

Figure 13G:
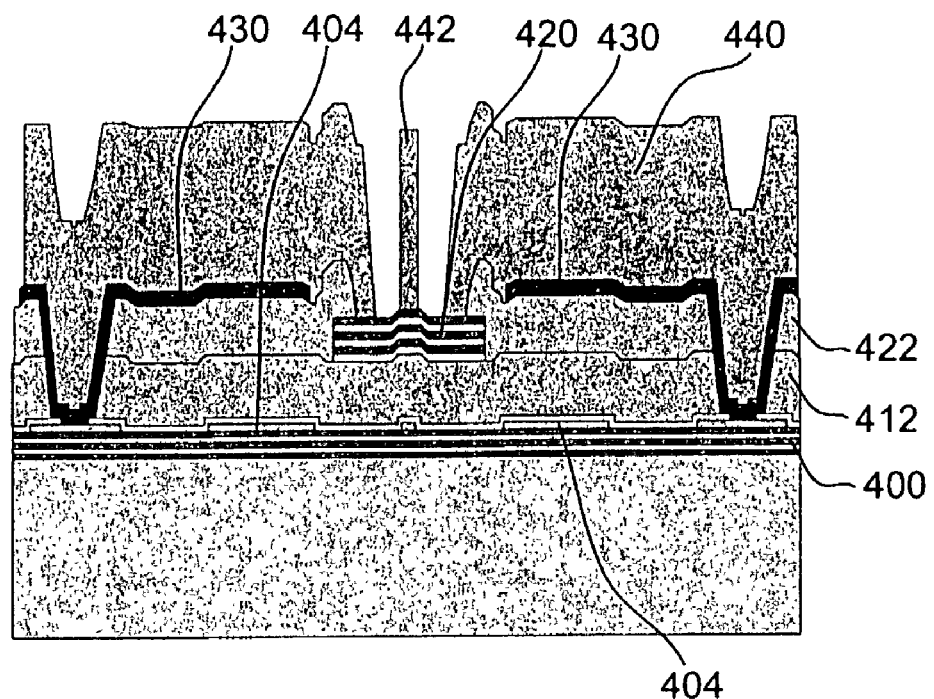

Next, and as shown in FIG. 13G, the support layer 340 is patterned to expose the top mirror 420. While a thin column member 442 remains in FIG. 13G, this is not required. In addition, the top mirror 420 is shown having a ridge in the central portion thereof. In some embodiments, this ridge may be eliminated, and the top mirror 420 may be substantially planar. Also, the support layer 340 may be patterned to define one or more elongated supporting legs, such as those shown and described with respect to FIGS. 4–7 above.

Figure 13H:
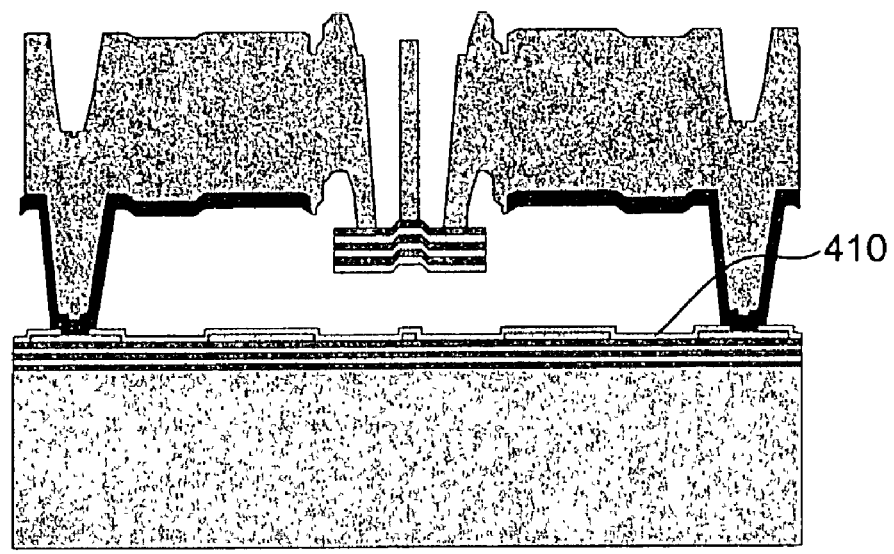

Preferably the support layer 440 overlaps the outer perimeter of the top mirror 420, as shown. This overlap helps form a bond between the support layer 440 and the top mirror 420. Finally, and as shown in FIG. 13H, a dry etch may be used to remove the first and second sacrificial layers 412 and 422 to releases the top structure from the bottom structure, as shown. The dry etch may be, for example, an oxygen plasma etch. An anneal may be performed to help reduce the stress in the structure, including in the $SiO_2$ support layer 440. The anneal may be performed before or after the first and second sacrificial layers 412 and 422 are removed, as desired.

The illustrative structure shown in FIGS. 13A–13H positions the top electrodes 430 further from the bottom electrodes 404 than the embodiment shown in FIGS. 12A–12I. It has been found that under some circumstances, the top electrodes 430 tend to snap down toward the bottom electrodes 404 when the distance between the top electrodes 430 and the bottom electrodes 404 is reduced through electrostatic actuation (e.g. when the distance is reduced by about one-third). Therefore, to increase the distance that the top mirror 420 can travel relative to the bottom mirror 400 without experiencing the snapping action, the top electrode 430 has been purposefully moved further from the bottom electrode 404. In addition, the top mirror 420 has been positioned below the top electrode 430, as shown.

Figure 14A:
FIGS. 14A–14K are schematic cross-sectional side views showing yet another illustrative method for making a tunable bandpass filter in accordance with the present invention.

FIGS. 14A–14K are schematic cross-sectional side views showing yet another illustrative method for making a tunable bandpass filter in accordance with the present invention. Turning first to FIG. 14A, a bottom mirror 450 is grown on a substrate 452. The substrate 452 may be, for example, Pyrex, sapphire or any other suitable material. The bottom mirror 450 is preferably a Distributed Bragg reflector that includes a semiconductor and/or dielectric mirror stack. The Distributed Bragg reflector may include, for example, a number of alternating layers of $ZrO_2/SiO_2$, $HfO_2/SiO_2$, etc. Alternatively, the bottom mirror 450 may simply include one or more metal layers, such as an Aluminum layer. It should be recognized that these are only illustrative, and that the bottom mirror 450 may be made from any suitable material or material system that provides the desired reflectivity.

Figure 14B:
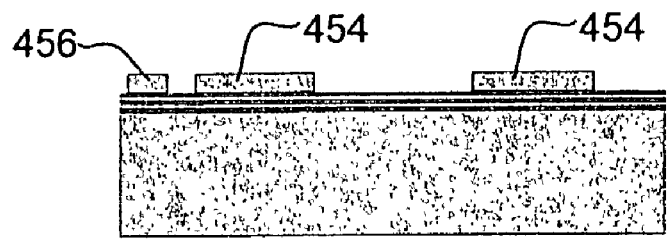
Figure 14C:
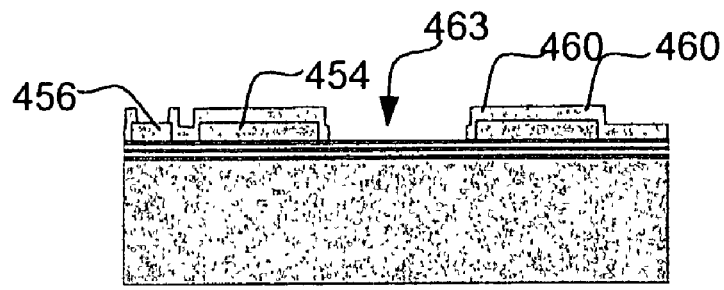

Next, and as shown in FIG. 14B, bottom electrodes 454 and bottom conducting pads 456 are provided. The bottom electrodes 454 and conducting pads 456 are preferably deposit by lift-off, but any suitable process may be used. Next, and as shown in FIG. 14C, a dielectric or other protecting layer 460 may be provided over the bottom electrodes 454 and bottom conducting pads 456. The dielectric or other protecting layer 460 may then be patterned to expose the bottom conducting pads 456 and the optical window area 463, as shown in FIG. 14C. Layer 460 may be any type of dielectric or other protecting layer including, for example, Alumina passivation.

Figure 14D:
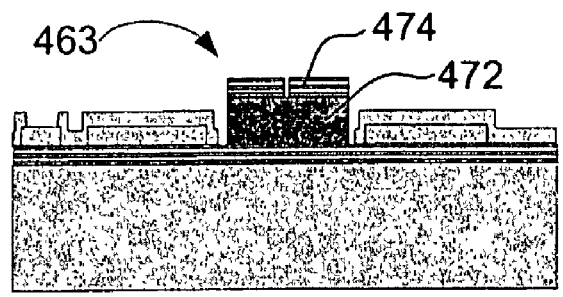

Next, and as shown in FIG. 14D, a first sacrificial layer 472 is provided and patterned in the optical window area 463. The first sacrificial layer 472 is preferably about 4000 A of metal, but may be any suitable material. Next, and as further shown in FIG. 14D, a top mirror 474 is provided. The top mirror 474 is preferably a Distributed Bragg reflector that includes a semiconductor and/or dielectric mirror stack. Like the bottom mirror 450, the Distributed Bragg reflector may include, for example, a number of alternating layers of $ZrO_2/SiO_2$, $HfO_2/SiO_2$, etc. Alternatively, the top mirror 474 may simply include one or more metal layers, such as one or more Aluminum layers. It should be recognized that these are only illustrative, and that the top mirror 474 may be made from any suitable material or material system that provides the desired reflectivity. The top mirror 474 is then patterned, as shown in FIG. 14D.

Figure 14E:
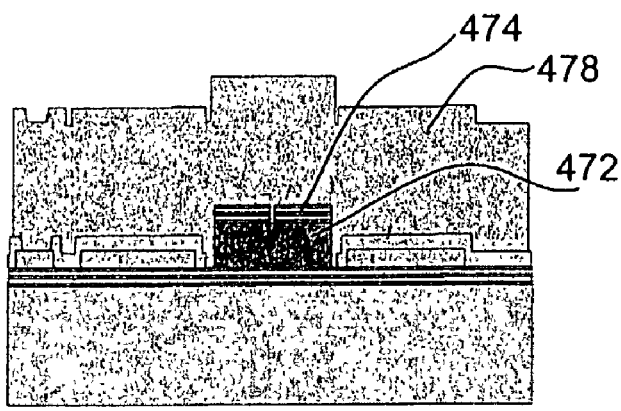
Figure 14F:
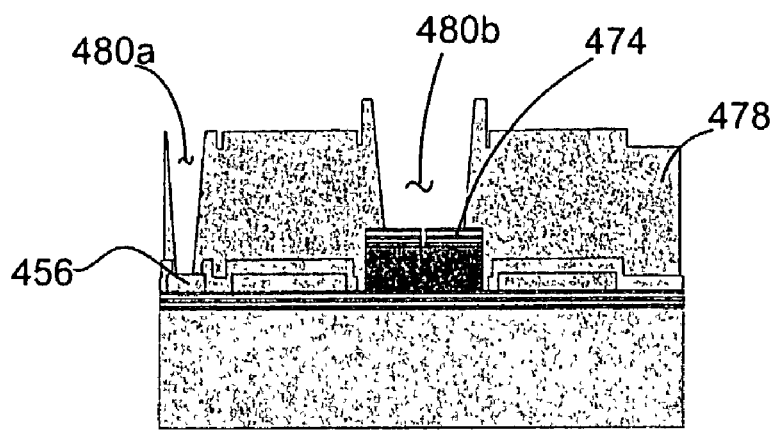

Next, and as shown in FIG. 14E, a second sacrificial layer 478 is provided over the patterned top mirror 474. The second sacrificial layer 478 is preferably about 8000 A of polimide, but may be any suitable material. Next, and as shown in FIG. 14F, one or more holes 480a and 480b are etched through the second sacrificial layer 478 down to the conductive pads 456 and the top mirror 474, respectively. The holes 480a and 480b preferably do not extend all the way to the lateral edges of the conductive pads 456 and the top mirror 474, but this is not required.

Figure 14G:
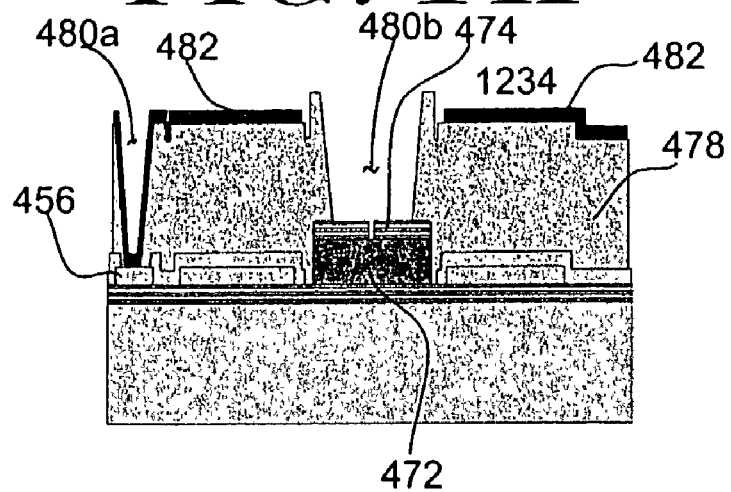

Next, and as shown in FIG. 14G, a metal layer is deposited and patterned to form top electrode regions 482. The metal layer 482 preferably extends into hole 480a to form an electrical connection with bottom conducting pads 456, as shown. The metal layer 482 preferably is removed from above the top mirror 474.

Figure 14H:
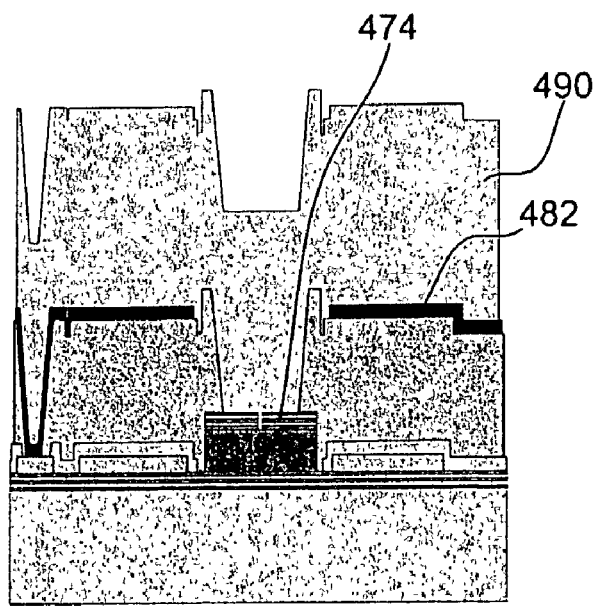

Next, and as shown in FIG. 14H, a support layer 490 is provided over the top surface of the resulting structure. The support layer 490 preferably bonds to the top mirror 474, and fills the hole 480b. A buffer layer may be provided first to help bond the layers, if desired. In a preferred embodiment, the support layer 490 is nominally about 3 $\mu$m of $SiO_2$, but other thicknesses and materials may be used.

Figure 14I:
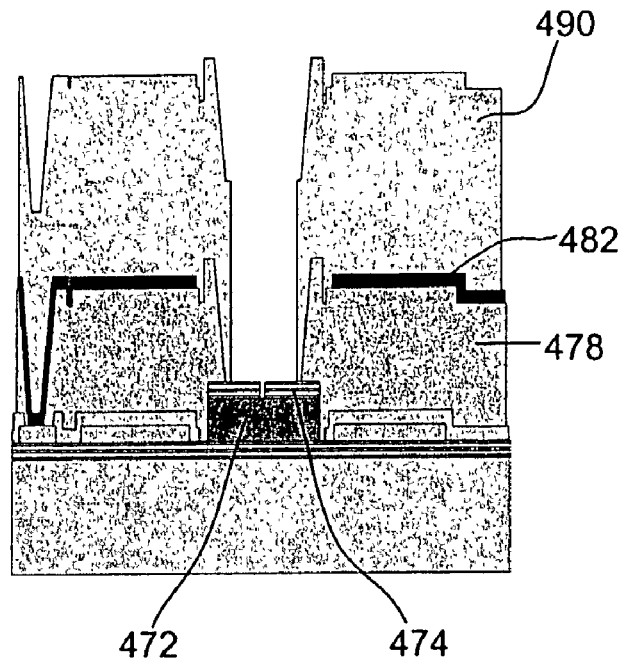

Next, and as shown in FIG. 14I, the support layer 490 is patterned to expose the top mirror 474. Preferably the support layer 490 overlaps the outer perimeter of the top mirror 474, as shown. This overlap helps form a bond between the support layer 490 and the top mirror 474. Also, the support layer 490 may be patterned to define one or more elongated supporting legs, such as those shown and described with respect to FIGS. 4–7 above.

Figure 14J:
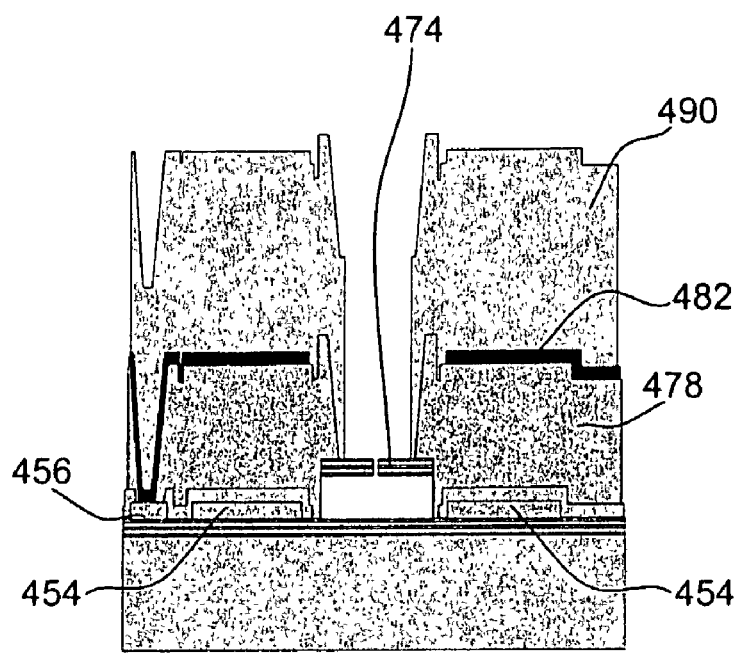

Next, and as shown in FIG. 14J, the first sacrificial layer 472 is removed. In a preferred embodiment, the first sacrificial layer 472 is removed with a wet etch to release the top mirror 474 from the bottom mirror 450. It is contemplated that the first sacrificial layer 472 may be made from a material that can be selectively etched relative to the remaining structure.

Figure 14K:
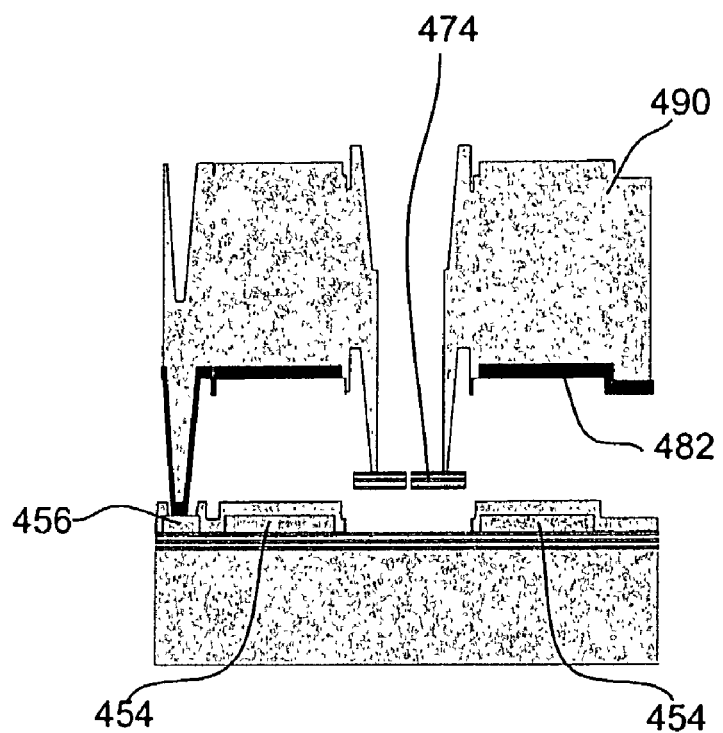

Next, and as shown in FIG. 14K, the second sacrificial layer 478 is removed to releases the top structure from the bottom structure, as shown. In a preferred embodiment, this may be performed using a dry etch such as an oxygen plasma etch. An anneal may be performed to help reduce the stress in the structure, including in the $SiO_2$ support layer 490. The anneal may be performed before or after the first and second sacrificial layers 472 and 478 are removed, as desired.

The illustrative structure shown in FIGS. 14A–14K positions the top electrodes 482 further from the bottom electrodes 454 than the embodiment shown in FIGS. 12A–12I. It has been found that under some circumstances, the top electrodes 482 tend to snap down toward the bottom electrodes 454 when the distance between the top electrodes 482 and the bottom electrodes 454 is reduced through electrostatic actuation (e.g. when the distance is reduced by about one-third). Therefore, to increase the distance that the top mirror 474 can travel relative to the bottom mirror 450 without experiencing the snapping action, the top electrodes 482 have been purposefully moved further from the bottom electrode 454. In addition, the top mirror 474 has been positioned below the top electrodes 482, as shown.

Figure 15A:
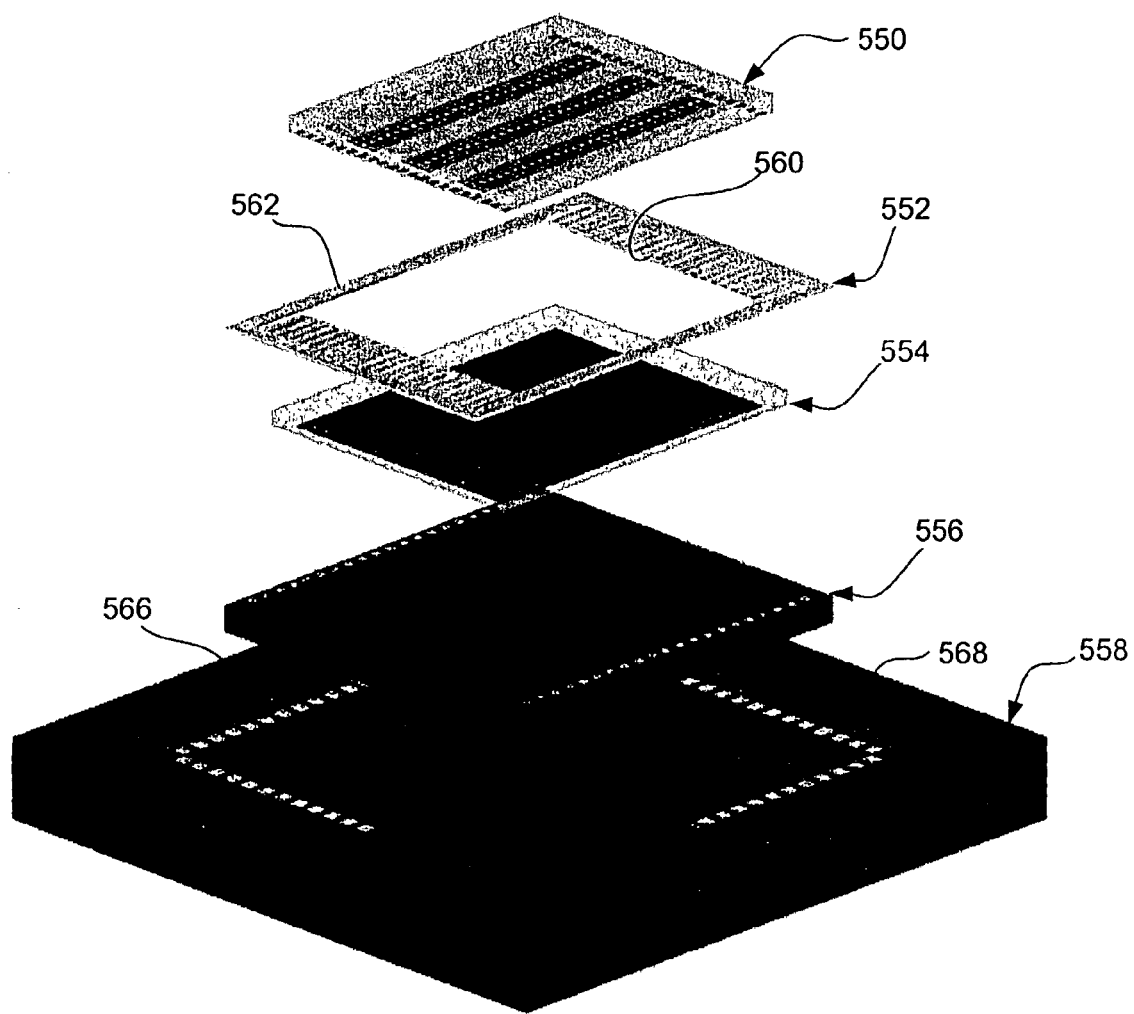
FIGS. 15A–15C are perspective views of an illustrative assembly of a tunable bandpass filter in accordance with the present invention.
Figure 15B:
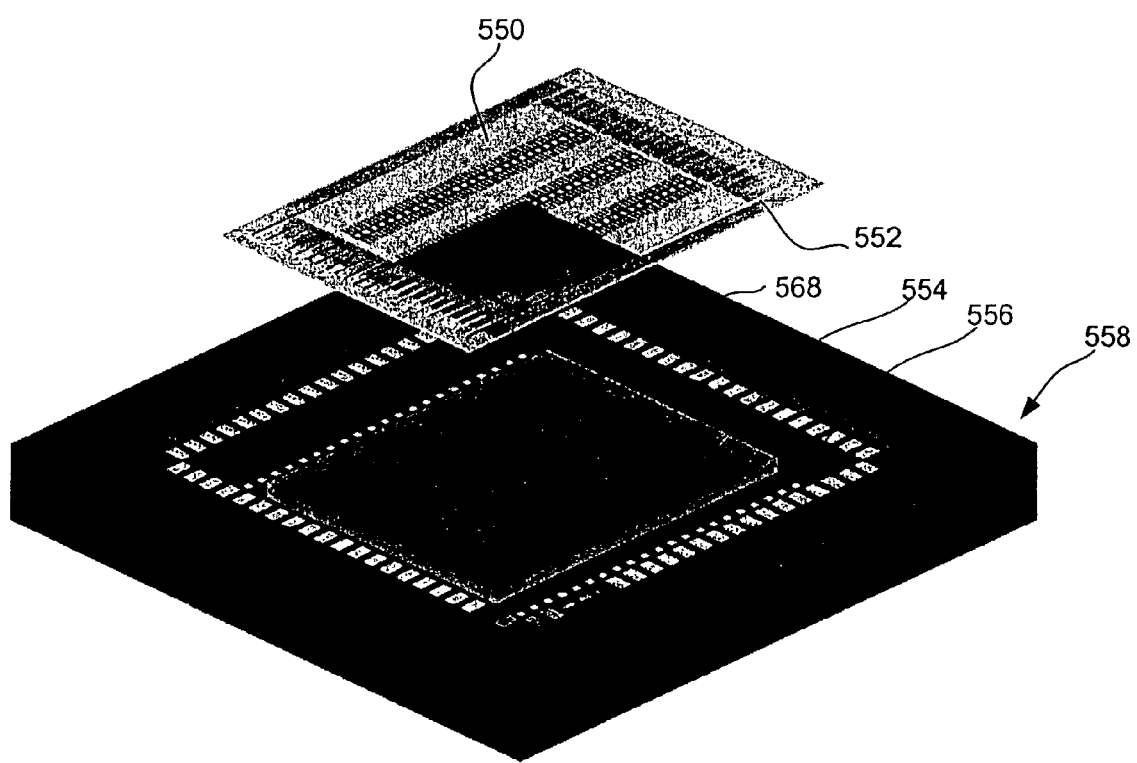
Figure 15C:
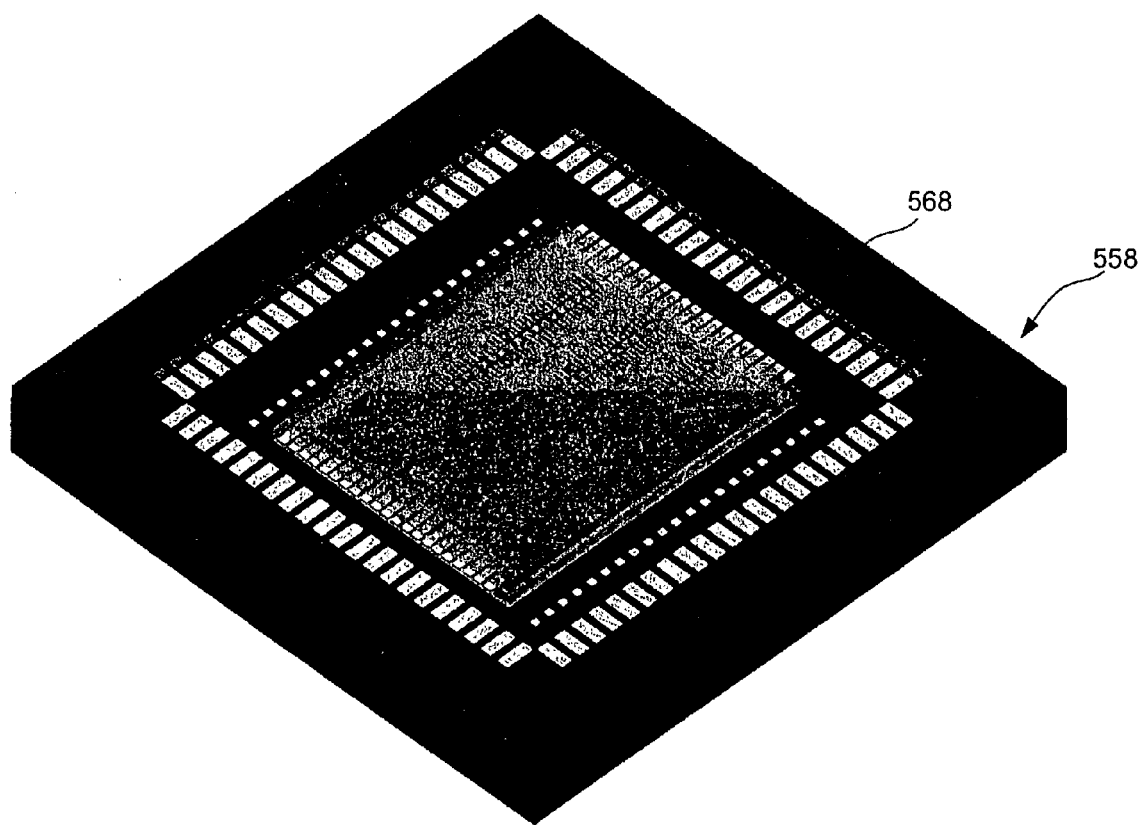

FIGS. 15A–15C are perspective views of an illustrative assembly of a tunable bandpass filter in accordance with the present invention. FIG. 15A shows various components including a tunable bandpass filter 550, a lead frame 552, a detector 554, readout electronics 556 and a package 558. The tunable bandpass filter 550 is preferably similar to the tunable bandpass filter 12 shown and described with reference to FIG. 1. More specifically, and in the illustrative embodiment, the tunable bandpass filter 550 may include a Micro Electro Optical Mechanical System (MEOMS) etalon fabricated on a front side of a substrate. In FIG. 15A, the back side of the substrate is shown facing up, with peripheral bond pads for the tunable bandpass filter elements positioned along two sides of the front side of the substrate.

The lead frame 552 is preferably fabricated so that the leads 560 are in registration with the peripheral bond pads of the tunable bandpass filter 550. FIG. 15B shows the bond pads of the tunable bandpass filter 550 bonded to the individual leads 560 of the lead frame 552. Once the bond pads on the tunable bandpass filter 550 are bonded to the corresponding leads 560 on the lead frame 552, the outer frame 562 of the lead frame 552 may be removed, as best shown in FIG. 15C. The portion of the leads 560 that extend out past the perimeter of the tunable bandpass filter 550 provide a wire bond pad for wire bonding the tunable bandpass filter 550 to the package 558, as further described below.

The detector 554 may be similar to the detector 14 of FIG. 1. That is, the detector 554 may be formed on a substrate, and positioned adjacent the tunable bandpass filter 550 to receive one or more wavelengths that are passed through the tunable bandpass filter 550. Readout electronics 556 may also be provided. The readout electronics 556 are preferably fabricated on a separate substrate using conventional integrated circuit processing techniques. Metal pads (not explicitly shown) may be provided on the readout electronics substrate to provide an electrical connection to the detector 554, as further described above with respect to FIG. 1. Bump bonds, for example, may be used to electrically connect one or more electrodes of the detector 554 to corresponding metal pads on the readout electronics 556. The illustrative readout electronics 556 also have peripheral bond pads along two sides of the readout electronics substrate, as shown.

The illustrative package 558 has an internal cavity 566 for receiving the readout electronics 556, detector 554, lead frame 552 and tunable bandpass filter 550. FIG. 15B shows the detector 454 and readout electronics 556 secured within the internal cavity 566 of the package 558. FIG. 15B also shows the tunable bandpass filter 550 and the lead frame 552 before they are inserted into the internal cavity 566 of the package 558. In the illustrative embodiment, the bond pads oil the readout electronics 556 extend along two opposing sides of the package 558, and the bond pads for the lead frame extend along the other two opposing sides of the package 558. Wire bond pads may be provided along an upper ledge 568 of the package 558. FIG. 15C shows the tunable bandpass filter 550 and the lead frame 552 after they have been inserted into the internal cavity 566 of the package 558. Bond wires may be provided between the bond pads on the upper ledge 568 of the package 558 to the bond pads of the lead frame and the bond pads of the readout electronics. A lid (not shown) may also be provided to seal the inner cavity of the package. In some embodiments, the lid may provide a vacuum seal.

Figure 16:
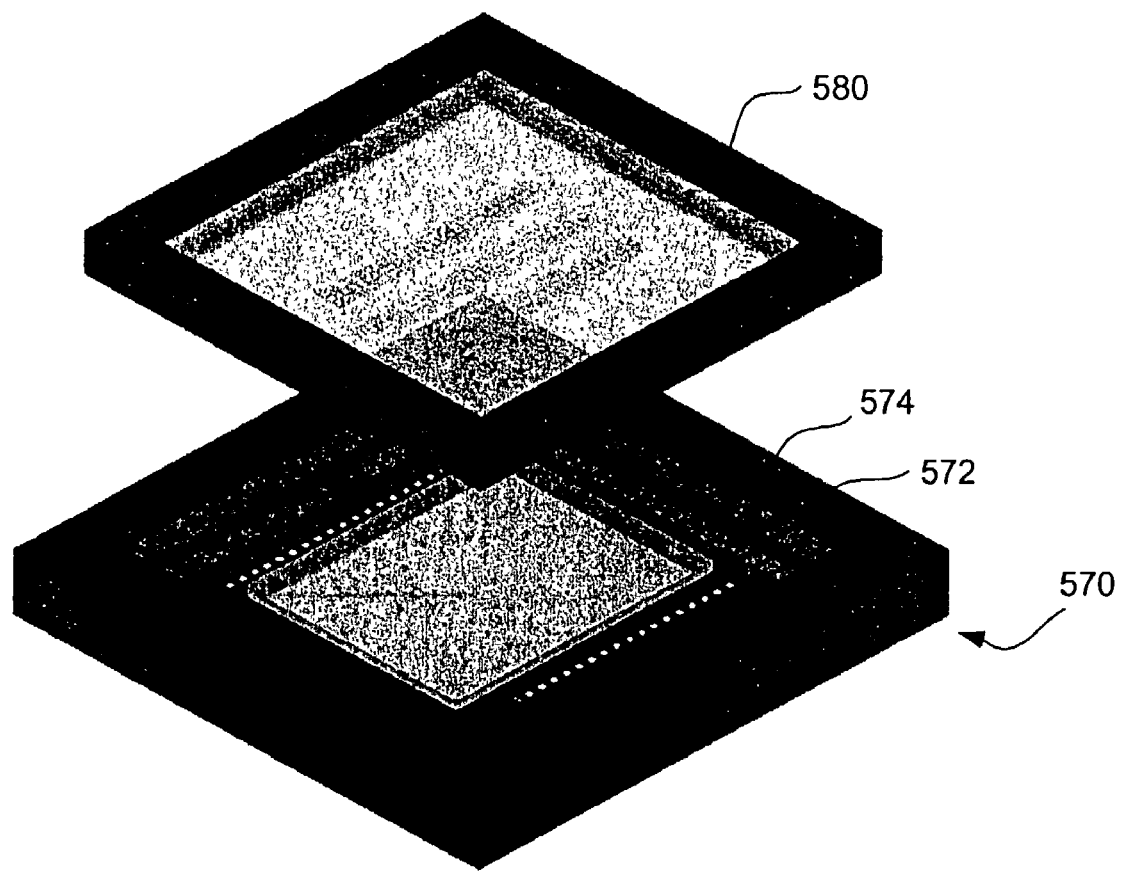
FIG. 16 is a perspective view of another illustrative assembly of a tunable bandpass filter in accordance with the present invention.

FIG. 16 is a perspective view of another illustrative assembly of a tunable bandpass filter in accordance with the present invention. The embodiment shown in FIG. 16 is similar to the shown in FIGS. 15A–15C. However, the package 570 of FIG. 16 includes an inner ledge 572 and an outer ledge 574 of bond pads. The inner ledge 572 is preferably positioned lower than the outer ledge. Like above, the detector 554 and readout electronics 556 are first secured in the internal cavity of the package 570. Before the tunable bandpass filter 550 is inserted, however, wire bonds or the like (not shown) are provided to electrically connect the bond pads of the readout electronics to the bond pads on the inner ledge 572 of the package 570.

The tunable bandpass filter 550 is secured to an inner package frame 580, rather than just a lead frame. The illustrative inner package frame 580 has metal pads that bond to bond pads on the substrate of the tunable bandpass filter 550. The inner package frame 580 is preferably sized to mate within an upper opening in the top surface of the package 570. Bump bonds may then be used to bond peripheral bond pads on the inner package frame 580 to the bond pads on the outer ledge 574 of the package 570. It is also recognized that the inner package frame 580 could have the same lateral dimensions as the package 570 with interconnections along the edge of the package 570. The vertical dimensions of the package 570 are designed to put the top substrate and bottom detector in close proximity, on the order of a few thousandths of an inch. Again, a lid (not shown) may be provided to seal the inner cavity of the package, as desired.

It should be understood that this disclosure is, in many respects, only illustrative. Changes may be made in details, particularly in matters of shape, size, and arrangement of steps without exceeding the scope of the invention. The invention's scope is, of course, defined in the language in which the appended claims are expressed.

What is claimed is:

1. A spectrally tunable detector, comprising:
a tunable bandpass filter having a first at least partially reflective plate and a second at least partially reflective plate separated by a separation gap, the tunable bandpass filter is selectively tuned to a bandpass wavelength that is less than 390 nm by moving the first plate and/or the second plate relative to one another to change the separation gap using an electrostatic force; and
a detector positioned adjacent the tunable bandpass filter to receive one or more wavelengths that are passed by the tunable bandpass filter and to provide an output signal in response thereto.

2. A spectrally tunable detector according to claim 1 wherein the tunable bandpass filter and the detector are fixed relative to one another.

3. A spectrally tunable detector according to claim 1 wherein the tunable bandpass filter is provided on a first substrate and the detector is provided on a second substrate, the first substrate and the second substrate being substantially transparent to the one or more wavelengths that are passed by the tunable bandpass filter.

4. A spectrally tunable detector according to claim 3 wherein first substrate is fixed relative to the second substrate.

5. A spectrally tunable detector according to claim 3 wherein an incoming light beam enters the tunable bandpass filter and subsequently passes through the first substrate.

6. A spectrally tunable detector according to claim 5 wherein the incoming light beam subsequently enters the detector through the second substrate.

7. A spectrally tunable detector according to claim 6 wherein the first substrate has a first major surface and an opposite second major surface, the first plate and the second plate of the tunable bandpass filter are positioned adjacent the first surface of the first substrate, and the second surface of the first substrate is positioned adjacent the second substrate.

8. A spectrally tunable detector according to claim 7 further comprising a read out circuit provided on a third substrate.

9. A spectrally tunable detector according to claim 8 wherein the detector is electrically connected to the read out circuit.

10. A spectrally tunable detector according to claim 8 wherein the third substrate is mounted to a package.

11. A spectrally tunable detector according to claim 3 wherein a lens is positioned adjacent the first substrate.

12. A spectrally tunable detector, comprising:
a tunable bandpass filter for selectively passing a band of wavelengths from a predetermined spectral range of wavelengths, the tunable bandpass filter having an etalon with a top plate and a bottom plate that are separated by a separation gap, both the top plate and the bottom plate having a reflective portion that is at least partially reflective, the top plate and/or bottom plate adapted to move relative to the other plate to vary the separation gap across a predetermined range of separation gaps, the separation gap at least partially determining the band of wavelengths that are passed by the tunable bandpass filter and the predetermined range of separation gaps at least partially determining the predetermined spectral range of wavelengths; and a detector positioned adjacent the tunable bandpass filter, the detector being sensitive to the predetermined spectral range of wavelengths but insensitive to wavelengths substantially outside of the predetermined spectral range of wavelengths; wherein a normalized response of the detector is greater than 90% across a frequency range, and the band of wavelengths passed by the tunable bandpass filter substantially fills said frequency range.

13. A spectrally tunable detector according to claim 12 wherein the etalon is a Micro Electro Optical Mechanical System (MEOMS) etalon.

14. A spectrally tunable detector according to claim 13 wherein the bottom plate is positioned atop a substrate.

15. A spectrally tunable detector according to claim 14 wherein the top plate is positioned above the substrate, and mechanically connected to the substrate by one or more support legs.

16. A spectrally Unable detector according to claim 15 further including one or more top electrodes coupled to the top plate.

17. A spectrally tunable detector according to claim 16 further including one or more bottom electrodes coupled to the substrate.

18. A spectrally tunable detector according to claim 17 further comprising a control circuit for applying a voltage between one or more of the top electrodes end one or more of the bottom electrodes to pull at least part of the top plate closer to at least part of the bottom plate via an electrostatic force to thereby reduce the separation gap between the reflective portion of the top plate and the reflective portion of the bottom plate.

19. A spectrally tunable detector according to claim 18 wherein the substrate is Pyrex.

20. A spectrally tunable detector according to claim 12 wherein the detector is an AlGaN diode.

21. A spectrally tunable detector according to claim 12 further comprising a lens for directing an incoming light beam to the tunable bandpass filter.

22. A spectrally tunable detector according to claim 12 wherein the tunable bandpass filter is adapted to allow only a single band of wavelengths from the predetermined spectral range of wavelengths for each separation gap in the predetermined range of separation gaps.

23. A spectrally tunable detector, comprising:

a tunable bandpass filter having a first at least partially reflective plate and a second at least partially reflective plate separated by a separation gap, the tunable bandpass filter is selectively tuned to a bandpass wavelength by moving the first plate and/or the second plate relative to one another to change the separation gap;

a detector fixed relative to a first substrate, the detector positioned adjacent the tunable bandpass filter to receive one or more wavelengths that are passed by the tunable bandpass filter and to provide an output signal in response thereto, the detector providing and/or receiving at least one electrical signal to/from a conductive pad that is accessible from a first side of the first substrate;

control electronics fixed relative a second substrate, the control electronics coupled to a conductive pad that is accessible from a first side of the second substrate; and the first side of the first substrate is positioned adjacent to the first side of the second substrate such that the conductive pad of the detector is electrically coupled and physically bonded to the conductive pad of the control electronics to pass the at least one electrical signal between the detector and the control electronics.

24. A spectrally tunable detector according to claim 23 Wherein the tunable bandpass filter is fixed relative to a third substrate, the tunable bandpass filter having one or more control signals fir controlling the separation gap, wherein the one or more control signals are electrically coupled to one or more conductive pads that are accessible from a first side of the third substrate.

25. A spectrally tunable detector according to claim 24 wherein the first substrate has a second side opposite to the first side, the second side of the first substrate having one or more conductive pads, the first side of the third substrate is positioned adjacent to the second side of the first substrate such that the one or more conductive pads of the tunable bandpass filter are electrically coupled and physically bonded to the one or more of the conductive pads of the second side of the first substrate.

* * * * *